(12) United States Patent
Chang et al.

(10) Patent No.: US 11,756,921 B2
(45) Date of Patent: Sep. 12, 2023

(54) SYSTEM AND METHOD FOR BONDING SEMICONDUCTOR DEVICES

(71) Applicant: Taiwan Semiconductor Manufacturing Co., Ltd., Hsinchu (TW)

(72) Inventors: Kai-Tai Chang, Kaohsiung (TW); Tung Ying Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 226 days.

(21) Appl. No.: 17/369,146

(22) Filed: Jul. 7, 2021

(65) Prior Publication Data

US 2022/0302078 A1 Sep. 22, 2022

Related U.S. Application Data

(60) Provisional application No. 63/162,664, filed on Mar. 18, 2021.

(51) Int. Cl.
*H01L 23/00* (2006.01)
*H01L 21/66* (2006.01)
(Continued)

(52) U.S. Cl.
CPC ........ *H01L 24/80* (2013.01); *H01L 21/67092* (2013.01); *H01L 21/68* (2013.01);
(Continued)

(58) Field of Classification Search
CPC . H01L 21/68; H01L 23/544; H01L 21/67092; H01L 24/80; H01L 22/12; H01L 2223/54426; H01L 2224/8013; H01L 24/08; H01L 24/94; H01L 2223/54453; H01L 2224/75753; H01L 2224/7595; H01L 2224/80006; H01L 2224/80097;
(Continued)

(56) References Cited

U.S. PATENT DOCUMENTS 10,943,807 B2  3/2021  Wagenleitner et al.
11,189,515 B2  11/2021  Wang et al.
(Continued)

FOREIGN PATENT DOCUMENTS

CN  104078372 A  10/2014
CN  109643674 A  4/2019
(Continued)

*Primary Examiner* — Bilkis Jahan
*Assistant Examiner* — Victor V Barzykin
(74) *Attorney, Agent, or Firm* — Slater Matsil, LLP

(57) ABSTRACT

A method includes determining a first offset between a first alignment mark on a first side of a first wafer and a second alignment mark on a second side of the first wafer; aligning the first alignment mark of the first wafer to a third alignment mark on a first side of a second wafer, which includes detecting a location of the second alignment mark of the first wafer; determining a location of the first alignment mark of the first wafer based on the first offset and the location of the second alignment mark of the first wafer; and, based on the determined location of the first alignment mark, repositioning the first wafer to align the first alignment mark to the third alignment mark; and bonding the first side of the first wafer to the first side of the second wafer to form a bonded structure.

20 Claims, 27 Drawing Sheets

(51) Int. Cl.
　　　*H01L 21/68*　　　(2006.01)
　　　*H01L 23/544*　　(2006.01)
　　　*H01L 21/67*　　　(2006.01)

(52) U.S. Cl.
　　　CPC ............ *H01L 21/681* (2013.01); *H01L 22/12* (2013.01); *H01L 23/544* (2013.01); *H01L 2223/54426* (2013.01); *H01L 2224/8013* (2013.01); *H01L 2224/80125* (2013.01)

(58) Field of Classification Search
　　　CPC . H01L 2224/80357; H01L 2224/80815; H01L 2224/80895; H01L 2224/80896; H01L 2224/80908; H01L 2224/94
　　　See application file for complete search history.

(56) References Cited

U.S. PATENT DOCUMENTS

| | | |
|---|---|---|
| 2005/0161837 A1 | 7/2005 | Matsui |
| 2008/0157407 A1 | 7/2008 | Chen et al. |
| 2017/0243853 A1 | 8/2017 | Huang et al. |

FOREIGN PATENT DOCUMENTS

| | | |
|---|---|---|
| EP | 1675165 A1 | 6/2006 |
| TW | 202002149 A | 1/2020 |

SYSTEM AND METHOD FOR BONDING SEMICONDUCTOR DEVICES

PRIORITY CLAIM AND CROSS-REFERENCE

This application claims priority to and the benefit of U.S. Provisional Application No. 63/162,664, filed on Mar. 18, 2021, which application is hereby incorporated herein by reference in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. For example, many integrated circuits may be manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
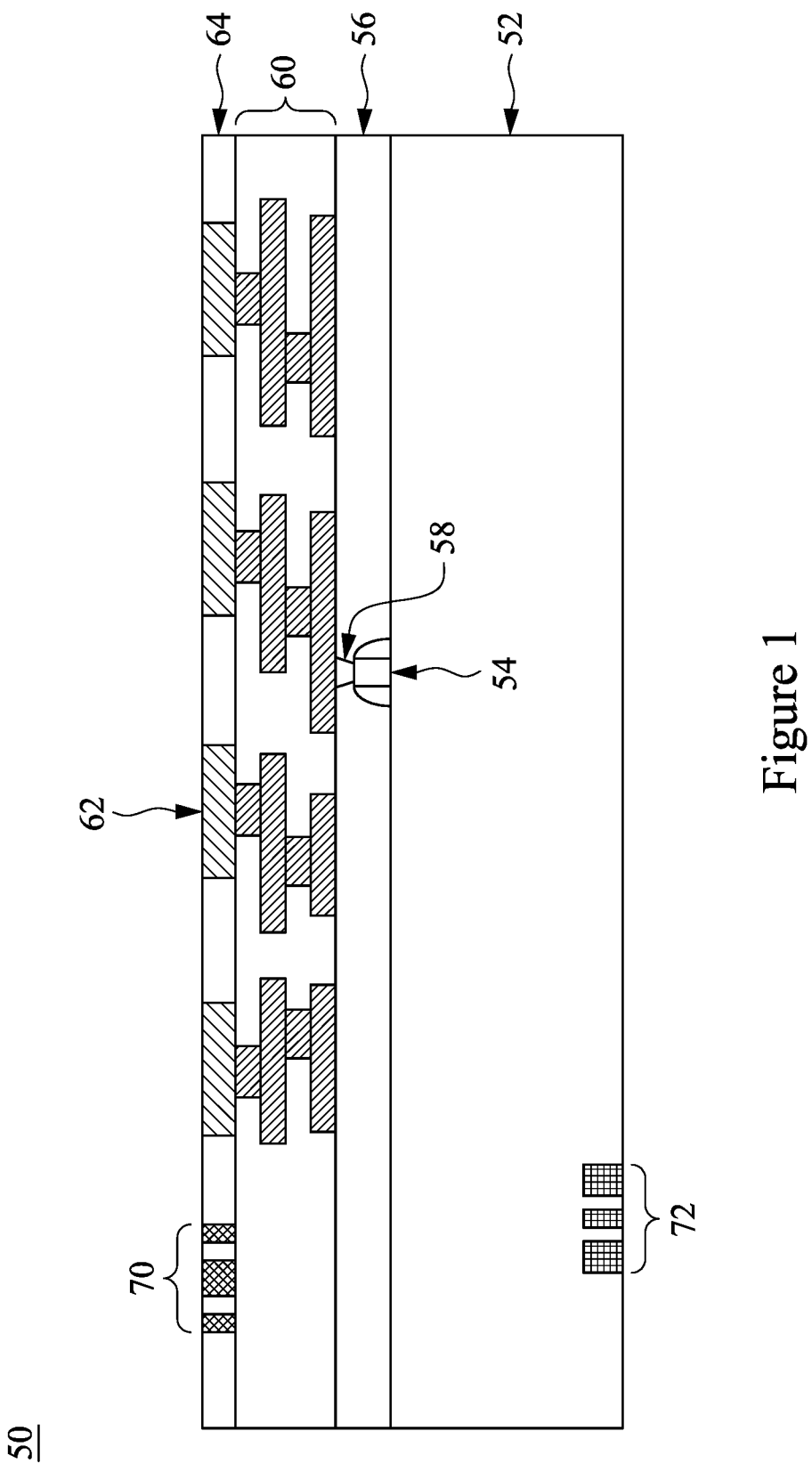
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A bonded structure and the method of manufacturing a bonded structure are provided in accordance with various exemplary embodiments. In some embodiments, the bonded structure may be a semiconductor package or the like formed by bonding a first bonding component to a second bonding component using direct bonding or the like. The bonding components may be wafers, chips, dies, substrates, or the like. An alignment mark may be formed on both a front side and a back side of a bonding component, and a spatial offset determined between the alignment mark on the front side and the alignment mark on the back side. The offset allows the location of the front-side alignment mark to be determined by detecting the location of the back-side alignment mark. In this manner, the location of the front-side alignment mark may be determined even when the front-side alignment mark is not directly visible. In this manner, the bonding components may be aligned according to their front-side alignment marks, which can improve alignment. Additionally, the use of a predetermined offset allows any misalignment of the front-side alignment marks may be measured after bonding by detecting the relative positions of the back-side alignment marks. This can improve the efficiency of identifying bonded structures that have alignments within tolerances.

Some variations of some embodiments are discussed. Throughout the various views and illustrative embodiments, like reference numbers are used to designate like elements. It is appreciated that although the formation of bonded structures is used as examples to explain the concept of the embodiments of the present disclosure, the embodiments of the present disclosure are readily applicable to package structures and packaging methods in which an offset between alignment marks on both sides of a bonding component may be used during alignment.

FIG. 1 illustrates a cross-sectional view of a semiconductor device 50, in accordance with some embodiments. The semiconductor device 50 may be, for example, an integrated circuit die, a CMOS die, a logic die (e.g., central processing unit (CPU), graphics processing unit (GPU), system-on-a-chip (SoC), input-output (IO), BaseBand (BB), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some cases, the semiconductor device 50 may be considered a package component or the like. The semiconductor device 50 may be similar to the semiconductor devices 410A-B, described below for FIG. 20.

The semiconductor device 50 may be formed in a wafer, in some embodiments. For example, the wafer may be a semiconductor substrate, a device wafer, an interposer wafer, a package substrate, or the like. Although one semiconductor device 50 is shown in FIG. 1, it is understood that a wafer may include multiple semiconductor devices 50, which may be separated from each other by scribe regions. For example, the wafer may include different device regions that are singulated in subsequent steps to form a plurality of semiconductor device 50. In this manner, the semiconductor device 50 shown in FIG. 1 may be a portion of a wafer or the like.

The semiconductor device 50 may be processed according to applicable manufacturing processes, such as those used to form integrated circuits. For example, the semiconductor device 50 includes a semiconductor substrate 52, which may be a wafer. The semiconductor substrate 52 may be a semiconductor material such as silicon, doped or undoped, an active layer of a semiconductor-on-insulator (SOI) substrate, an active layer of a semiconductor-on-sapphire substrate, or the like. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 (represented by a transistor in FIG. 1) may be formed at the front surface of the semiconductor substrate 52. The devices 54 may be, for example, integrated circuit devices or the like comprising active and/or passive devices. The devices 54 may comprise one or more active devices such as a diode, a photodiode, a fuse device, a Complementary Metal-Oxide Semiconductor (CMOS) transistor, a Fin Field Effect Transistor (FinFET), a Nanostructure (e.g., nanosheet, nanowire, gate-all-around, or the like) Field Effect Transistor (NSFET), the like, or combinations thereof. The devices 54 may comprise one or more passive devices such as a capacitor, a resistor, an inductor, the like, or combinations thereof. In some embodiments, the semiconductor device 50 is free of active devices. In other embodiments, the semiconductor device 50 is free of passive devices.

An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), Fluorine-Doped Silicate Glass (FSG), undoped Silicate Glass (USG), or the like. In some embodiments, the ILD 56 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like. Conductive plugs 58 extend at least partially through the ILD 56 to electrically and physically couple the devices 54. For example, when the devices 54 are transistors, the conductive plugs 58 may couple the gates and/or the source/drain regions of the transistors. The conductive plugs 58 may be formed of tungsten, cobalt, nickel, copper, silver, gold, aluminum, the like, or combinations thereof.

In some embodiments, an interconnect structure 60 is formed over the ILD 56 and conductive plugs 58. The interconnect structure 60 interconnects the devices 54 to form an integrated circuit and may comprise, for example, one or more metallization patterns in one or more dielectric layers on the ILD 56. The dielectric layers may be inter-metal dielectric layers (IMDs), and one or more of the dielectric layers may be formed of a low-k dielectric material, in some embodiments. For example, the dielectric layers may be formed of Black Diamond® (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, some or all of dielectric layers are formed of non-low-k dielectric materials such as silicon oxide, silicon carbide (SiC), silicon carbo-nitride (SiCN), silicon oxy-carbo-nitride (SiOCN), or the like.

The metallization patterns of the interconnect structure 60 are electrically coupled to the devices 54 by the conductive plugs 58. The metallization patterns of the interconnect structure 60 may include conductive features interconnected to each other and embedded in the one or more dielectric layers. The conductive features may include multi-layers of conductive lines, conductive vias, and/or conductive contacts. The conductive vias may be formed in the dielectric layers to electrically connect the conductive lines in different layers. The conductive features of the metallization patterns may be formed of one or more metals, metal alloys, or a combination thereof. For example, the conductive features may comprise copper, copper alloys, aluminum, aluminum alloys, tantalum, TaN, titanium, TiN, cobalt, tungsten, CoW, ruthenium, the like, or combinations thereof. In some embodiments, some conductive features may include a liner. The liner may include dielectric material(s) such as silicon oxide, silicon nitride, silicon oxynitride, the like, or combinations thereof. In some embodiments, the topmost conductive features of the metallization patterns have top surfaces that are substantially coplanar (e.g., within process variations) with a top surface of the dielectric structure.

In some embodiments, the semiconductor device 50 further includes conductive pads 62, such as metal pads, to which external connections are made. In some embodiments, the conductive pads 62 may be conductive features of the interconnect structure 60. The conductive pads 62 may be formed in a surface dielectric layer 64 over the interconnect structure 60, in some embodiments. The surface dielectric layer 64 may be formed at the surface of the semiconductor device 50. In some embodiments, the surface dielectric layer 64 is a silicon-containing dielectric layer, which may comprise silicon oxide, silicon oxynitride, silicon nitride, or the like, though other materials are possible. The material of the surface dielectric layer 64 may be chosen to facilitate bonding at the surface dielectric layer 64 to form a bonded structure, such as bonded structure 150 shown in FIGS. 6-7, described in greater detail below. For example, the bonding may be a bonding process including dielectricto-dielectric bonding and/or metal-to-metal bonding (e.g., direct bonding, fusion bonding, oxide-to-oxide bonding, hybrid bonding, or the like). The conductive pads 62 may be formed using suitable techniques, such as using a damascene process, a dual damascene process, or the like. In some embodiments, the conductive pads 62 have top surfaces that are substantially coplanar with a top surface of the surface dielectric layer 64.

In some embodiments, the semiconductor device 50 includes front-side alignment marks 70 and/or back-side alignment marks 72 (collectively referred to herein as "alignment marks 70/72"). The alignment marks 70/72 may provide features for alignment during bonding, photolithographic processing, device testing, inspection, measurement, or the like. For example, the alignment marks 70/72 may allow for the alignment of the semiconductor device 50 during a bonding process, such as one or more of the bonding processes described below for FIGS. 2-7. The front-side alignment marks 70 may be formed at or near the front side of the semiconductor device 50, and the back-side alignment marks 72 may be formed at or near the back side of the semiconductor device 50. In some embodiments, the front-side alignment marks 70 are dummy structures that are electrically isolated from the interconnect structure 60 or the conductive pads 62. In some embodiments, the front-side alignment marks 70 are electrically coupled to the interconnect structure 60 or the conductive pads 62. In some embodiments, the alignment marks 70/72 may be grounded. The alignment marks 70/72 may include, for example, a photo alignment mark, a scanning electron microscope (SEM) mark, a laser mark, or another type of alignment mark.

The alignment marks 70/72 may be formed in one or more semiconductor devices 50 of the same wafer, in some embodiments. FIG. 1 shows the front-side alignment marks 70 and the back-side alignment marks 72 formed in a semiconductor device 50, but in other embodiments one or more front-side alignment marks 70 and/or back-side alignment marks 72 are formed in scribe regions. In some embodiments, the front-side alignment marks 70 are formed prior to performing a bonding process, and the back-side alignment marks 72 are formed as part of the bonding process, described in greater detail below for FIGS. 13-19. In FIG. 1, the front-side alignment marks 70 are shown formed in the surface dielectric layer 64 and the back-side alignment marks 72 are shown formed in the semiconductor substrate 52, but the alignment marks 70/72 may be formed in any suitable layer of the semiconductor device 50, such as in a dielectric layer(s) of the interconnect structure 60, in the ILD 56, or the like.

The alignment marks 70/72 may be formed using suitable techniques, such as using a laser drilling process, using a photolithography and etching process, or the like. For example, a photolithography and etching process may be used to pattern openings in a layer corresponding to the alignment marks 70/72, and then one or more materials (e.g., dielectric, conductive, etc.) may be deposited in the openings to form the alignment marks 70/72. In other embodiments, the alignment marks 70/72 are openings or recesses that are not filled with a material. In some embodiments, the alignment marks 70/72 are formed using one or more of the same processing steps used to form features of the semiconductor device 50. For example, the alignment marks 70/72 may be formed of conductive material using the same processing steps that form the conductive pads 62 or a metallization pattern of the interconnect structure 60. The alignment marks 70/72 may be formed using other processing steps than these examples. The front-side alignment marks 70 may be formed using a different technique than the back-side alignment marks 72, in some embodiments. Other techniques of forming the alignment marks 70/72 are possible, and are considered within the scope of the present disclosure.

FIGS. 2 through 7 illustrate schematic views of a bonding system 100 and a bonding process that forms a bonded structure 150 (see FIGS. 6-7), in accordance with some embodiments. The bonding process may be used, for example, to form a bonded structure 150 by bonding a first semiconductor device 110A to a second semiconductor device 110B. The first semiconductor device 110A and the second semiconductor device 110B (collectively referred to herein as "semiconductor devices 110A-B") may be, for example, integrated circuit dies, wafers, package components, or the like, and are described in greater detail below. In some embodiments, one or both of the semiconductor devices 110A-B is similar to the semiconductor device 50 described for FIG. 1. The bonded structure 150 may be, for example, a package, a System on Chip (SoC), a System on Integrated Circuit (SoIC), a three-dimensional integrated circuit (3DIC), or the like. In some embodiments, the bonded structure 150 may be subsequently singulated to form individual packages or the like.

Figure 2:
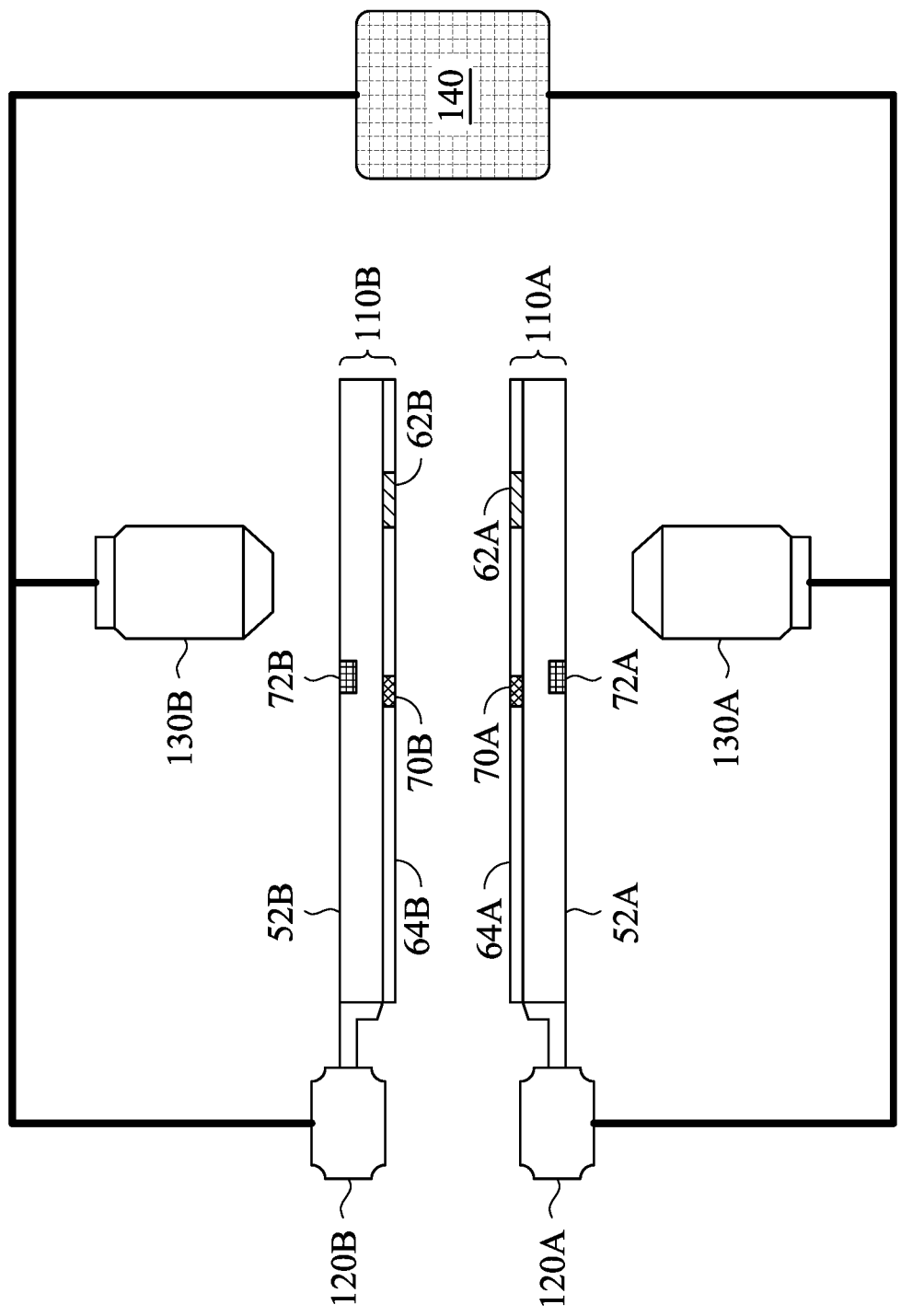
FIGS. 2, 3A, 3B, 4, 5, 6, and 7 illustrate cross-sectional views of intermediate steps during a process for forming a bonded structure in accordance with some embodiments.

FIG. 2 shows a schematic view of a bonding system 100, in accordance with some embodiments. The bonding system 100 can be used to bond, wafers, devices, package components, or the like using a bonding technique such as silicon-on-silicon bonding, direct bonding, semiconductor-on-insulator (SOI) bonding, fusion bonding (e.g., hydrophilic bonding or hydrophobic bonding), hybrid bonding, or the like. The bonding system 100 may be used, for example, to perform the bonding process that bonds the first semiconductor device 110A and the second semiconductor device 110B to form the bonded structure 150. The bonding system 100 shown in FIGS. 2-7 is a representative example of a bonding system for illustrating a bonding process, and the techniques described in this disclosure should not be considered as limited to any particular bonding systems or types of bonded structures.

The bonding system 100 includes a first holder 120A, a second holder 120B, a first microscope 130A, a second microscope 130B, and a controller 140, in some embodiments. The first holder 120A and the second holder 120B (collectively referred to herein as "holders 120A-B") may be chucks, supports, stages, or the like that are configured to hold the semiconductor devices 110A-B during a bonding process. For example, the first holder 120A may hold the first semiconductor device 110A and the second holder 120B may hold the second semiconductor device 110B. As shown in FIG. 2, the second holder 120B may be located generally above the first holder 120A in some embodiments, and in this manner the first holder 120A may be considered a lower holder and the second holder 120B may be considered an upper holder.

The holders 120A-B may comprise actuators that allow the positions of the semiconductor devices 110A-B to be adjusted. For example, the holders 120A-B may adjust locations along an x-axis, a y-axis, and/or a z-axis or may adjust orientations, rotation angles, tilt angles, or the like. For example, the actuators of the first holder 120A may adjust a position of the first semiconductor device 110A, and the actuators of the second holder 120B may adjust a position of the second semiconductor device 110B. The positions of the first semiconductor device 110A and the second semiconductor device 110B may be adjusted relative to each other or adjusted relative to a reference position. For example, the semiconductor devices 110A-B may be moved to positions corresponding to particular (x, y, z)-coordinates. The actuators may comprise, for example, stepper motors, piezoelectric motors, linear motors, another type of motor, or the like.

In some embodiments, the first microscope 130A and the second microscope 130B (collectively referred to herein as "microscopes 130A-B") of the bonding system 100 may be configured to detect or image alignment marks of the semiconductor devices 110A-B (e.g., alignment marks 70A-B or 72A-B, described below). As shown in FIG. 2, the first microscope 130A may be located on one side of the semiconductor devices 110A-B and the second microscope 130B may be located on an opposite side of the semiconductor devices 110A-B. For example, the first microscope 130A may be located under the first semiconductor device 110A and the second microscope 130B may be located above the second semiconductor device 110B. In this manner, the first microscope 130A may be considered a lower microscope and the second microscope 130B may be considered an upper microscope, in some embodiments. The microscopes 130A-B may comprise an optical microscope, an infrared microscope, a scanning electron microscope (SEM), or the like. The microscopes 130A-B may be configured to generate a digital image, in some embodiments. In some embodiments, the microscopes 130A-B may comprise actuators configured to adjust the positions of the microscopes 130A-B. For example, the microscopes 130A-B may be adjusted along an x-axis, a y-axis, or a z-axis, or the microscopes 130A-B may be moved to positions corresponding to particular (x, y, z)-coordinates.

In some embodiments, the bonding system 100 includes a controller 140 that is communicatively coupled to the first holder 120A, the second holder 120B, the first microscope 130A, and the second microscope 130B. The controller 140 may be configured to send signals to these coupled components and may be configured to receive signals from these coupled components. For example, in some embodiments, the controller 140 may send a signal to one of the holders 120A-B that instructs that holder to adjust its position. In some embodiments, the controller 140 is configured to receive a signal from one of the holders 120A-B that indicates a position. In some embodiments, the controller 140 is configured to store a position received from a holder 120A-B and subsequently send a signal that instructs that holder 120A-B to move to the stored position. In some embodiments, the controller 140 may send signals to the microscopes 130A-B to control their operation, such as focusing, position adjustment, image capture, or the like. In some embodiments, the controller 140 may receive a signal from one of the microscopes 130A-B that corresponds to, for example, a captured image, the detection of an alignment mark, a position, or the like.

Referring to FIG. 2, one or both of the semiconductor devices 110A-B may be similar to the semiconductor device 50 described for FIG. 1. For example, the first semiconductor device 110A and/or the second semiconductor device 110B may be an integrated circuit die (singulated or unsingulated), a wafer, a package component, or the like. The first semiconductor device 110A may be a different type of device than the second semiconductor device 110B, in some embodiments. For example, in some embodiments, one of the semiconductor devices 110A-B may be a digital circuit die, and the other may be an analog circuit die. In other embodiments, the first semiconductor device 110A may comprise a logic die while the second semiconductor device 110B may comprise a memory die. These are examples, and other combinations of device types are possible. One or both of the semiconductor devices 110A-B may be similar to the semiconductor devices 410A-B (see FIG. 20), semiconductor device 510 (see FIG. 22), or substrate 511 (see FIG. 22). Dividing the functions and circuits of a bonded structure 150 into different semiconductor devices may improve device operation, improve manufacturing efficiency, or reduce manufacturing cost.

In some embodiments, the semiconductor devices 110A-B may include features similar to those described for the semiconductor device 50 shown in FIG. 1. For example, in some embodiments, the first semiconductor device 110A may have a surface dielectric layer 64A and conductive pads 62A formed on its front side, and the second semiconductor device 110B may have a surface dielectric layer 64B and conductive pads 62B formed on its front side. The surface dielectric layers 64A-B and the conductive pads 62A-B may be similar to the surface dielectric layers 64 and conductive pads 62 described for the semiconductor device 50. In some embodiments, the first semiconductor device 110A may have a semiconductor substrate 52A, and the second semiconductor device 110B may have a semiconductor substrate 52B. The semiconductor substrates 52A-B may be similar to the semiconductor substrate 52 described for the semiconductor device 50. In some embodiments, the first semiconductor device 110A may have one or more front-side alignment marks 70A and may have one or more back-side alignment marks 72A, and the second semiconductor device 110B may have one or more front-side alignment marks 70B and may have one or more back-side alignment marks 72B. The front-side alignment marks 70A-B and the back-side alignment marks 72A-B may be similar to the alignment marks 70/72 of the semiconductor device 50, in some embodiments. For clarity, some features of the semiconductor device 50 shown in FIG. 1 may not be shown for the semiconductor devices 110A-B in other figures.

In some embodiments, the semiconductor devices 110A-B may be placed in the bonding system 100 such that the back side of the first semiconductor device 110A faces the first microscope 130A and the back side of the second semiconductor device 110B faces the second microscope 130B. In this manner, the front side of the first semiconductor device 110A is bonded to the front side of the second semiconductor device 110B. In other embodiments, the front side of the first semiconductor device 110A may face the first microscope 130A and/or the front side of the second semiconductor device 110B may face the second microscope 130B.

Figure 25:
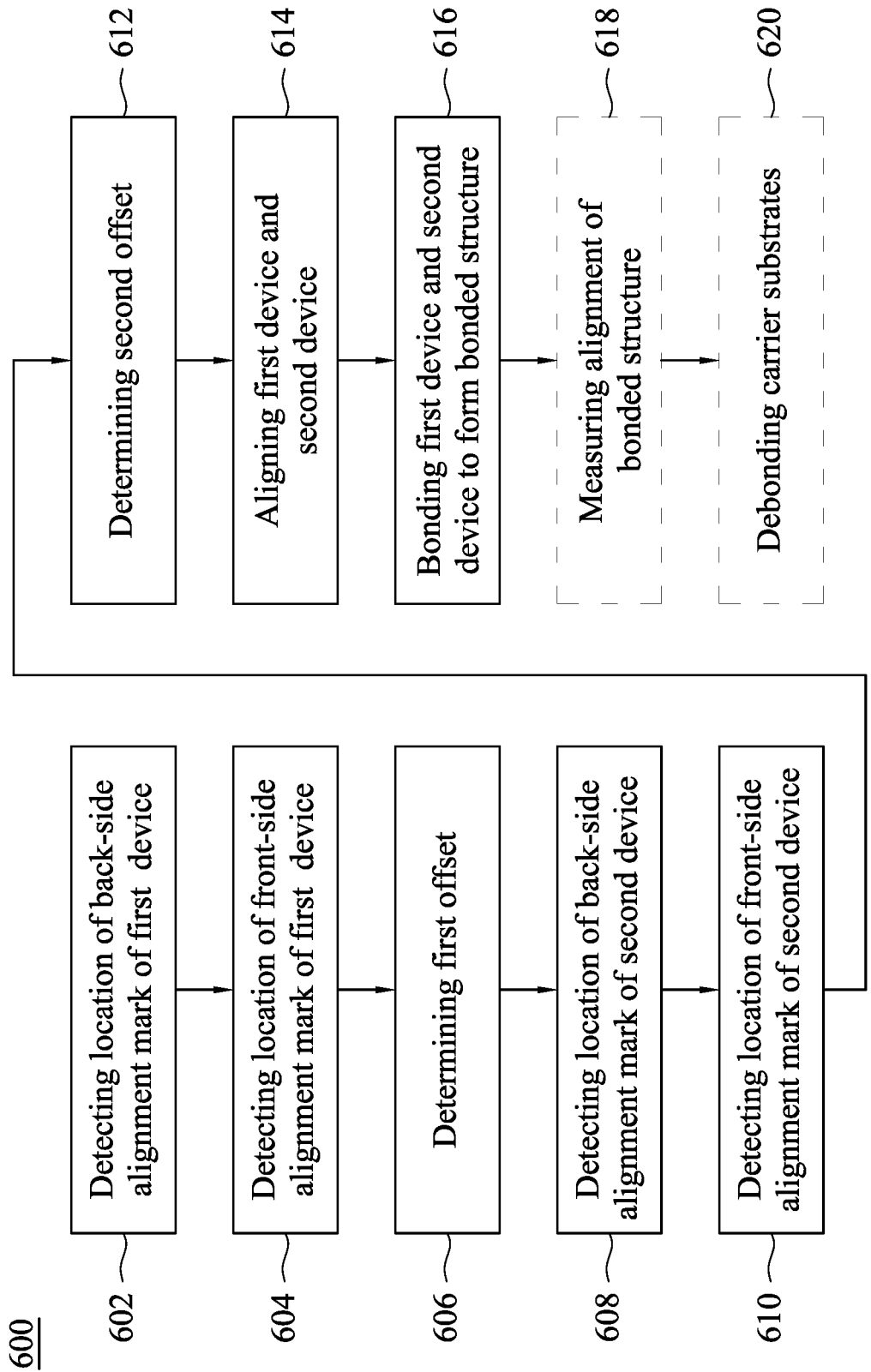
FIG. 25 illustrates a process flow for forming a bonded structure in accordance with some embodiments.

FIGS. 3A through 7 illustrate intermediate steps in the bonding of the first semiconductor device 110A to the second semiconductor device 110B to form the bonded structure 150, in accordance with some embodiments. Some of the steps shown in FIGS. 3A-7 correspond to steps of the process flow 600 shown below in FIG. 25.

Figure 3A:
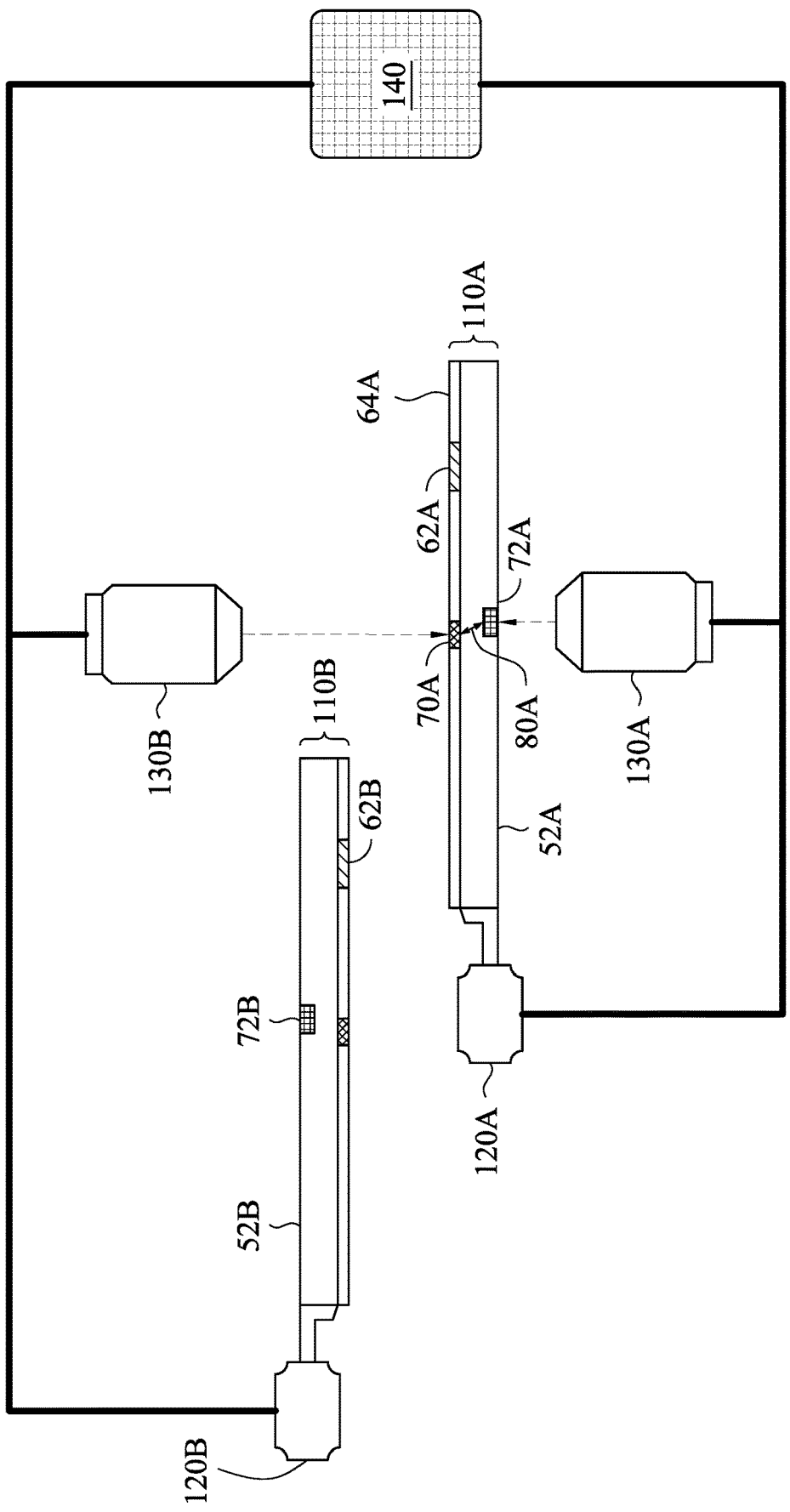

In FIG. 3A, the first microscope 130A detects the location of the back-side alignment mark 72A of the first semiconductor device 110A, and the second microscope 130B detects the location of the front-side alignment mark 70A of the first semiconductor device 110A. This corresponds to steps 602 and 604 of the process flow 600 shown in FIG. 25. In some embodiments, the second semiconductor device 110B may be retracted by the second holder 120B in order to allow the second microscope 130B to detect the front-side alignment mark 70A without being blocked by the second semiconductor device 110B, as shown in FIG. 3A. The locations of the alignment marks 70A/72A may correspond to, for example, (x, y, z)-coordinates, positions of the holders 120A-B, positions of the microscopes 130A-B (e.g., as the alignment marks 70A/72A are being detected or imaged), or the like. The locations of the alignment marks 70A/72A may be absolute locations or may be locations relative to another location. The locations of the alignment marks 70A/72A may be determined at least partially from the position of the first holder 120A, the position of the first microscope 130A, and/or the position of the second microscope 130B, in some cases. In some embodiments, the controller 140 determines the positions of the alignment marks 70A/72A based on signals received from the first holder 120A, the first microscope 130A, and/or the second microscope 130B. In some embodiments, the location of a device feature at or near the front side of the first semiconductor device 110A is detected instead of the location of a front-side alignment mark 70A, described in greater detail for FIGS. 8-9.

In some embodiments, a first offset 80A is determined between a location of the front-side alignment mark 70A and a location of the back-side alignment mark 72A of the first semiconductor device 110A. This corresponds to step 606 of the process flow 600 shown in FIG. 25. The first offset 80A may correspond to a difference between a detected location of the front-side alignment mark 70A and a detected location of the back-side alignment mark 72A. For example, the first offset 80A may indicate the location of the front-side alignment mark 70A relative to the back-side alignment mark 72A, or indicate the location of the back-side alignment mark 72A relative to the front-side alignment mark 70A.

Figure 3B:
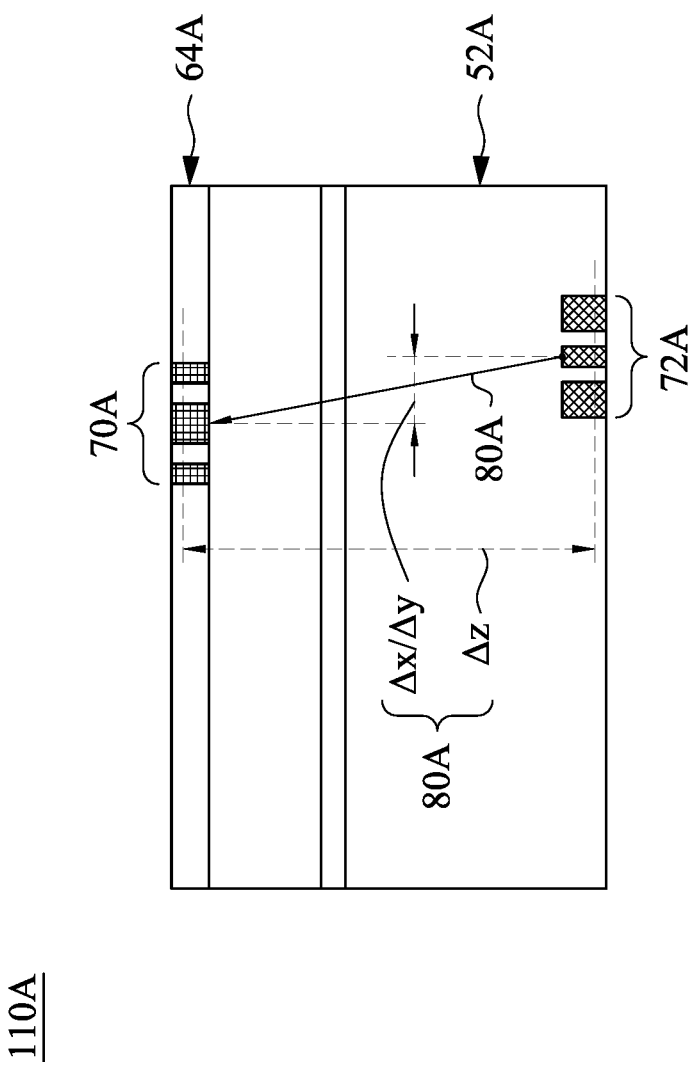

FIG. 3B shows a magnified portion of a first semiconductor device 110A, and show schematic representations of a first offset 80A between the front-side alignment mark 70A and the back-side alignment mark 72A, in accordance with some embodiments. As shown in FIG. 3B, the first offset 80A represents the difference in locations between the front-side alignment mark 70A and the back-side alignment mark 72A. The first offset 80A may be represented as a vector, as differential (x, y, z)-coordinates, or the like. For example, the first offset 80A may be represented as ($\Delta x$, $\Delta y$, $\Delta z$) in which $\Delta x$ represents a difference along an x-axis, $\Delta y$ represents a difference along a y-axis, and $\Delta z$ represents a difference along a z-axis. In this manner, the first offset 80A may comprise a lateral offset ($\Delta x$, $\Delta y$) and/or a vertical offset ($\Delta z$).

Because the first offset 80A represents the relative locations of the alignment marks 70A/72A, the location of one of the alignment marks 70A/72A may be determined from the other of the alignment marks 70A/72A and the first offset 80A. As an example, if a location of the back-side alignment mark 72A is detected to be at coordinates (x, y, z) and the first offset 80A is determined to be ($\Delta x$, $\Delta y$, $\Delta z$), then a location of the front-side alignment mark 70A may be determined to be at coordinates (x+$\Delta x$, y+$\Delta y$, z+$\Delta z$). This is an illustrative example, and in other embodiments, the first offset 80A may be represented in a different manner, or locations of the alignment marks 70A/72A may be determined in a different manner. Thus, a location of the front-side alignment mark 70A may be determined from a detected location of the back-side alignment mark 72A and a predetermined first offset 80A. Similarly, a location of the back-side alignment mark 72A may be determined from a detected location of the front-side alignment mark 70A and a predetermined first offset 80A. The first offset 80A or a location of an alignment mark 70A/72A may be determined by the controller 140, in some embodiments.

Figure 4:
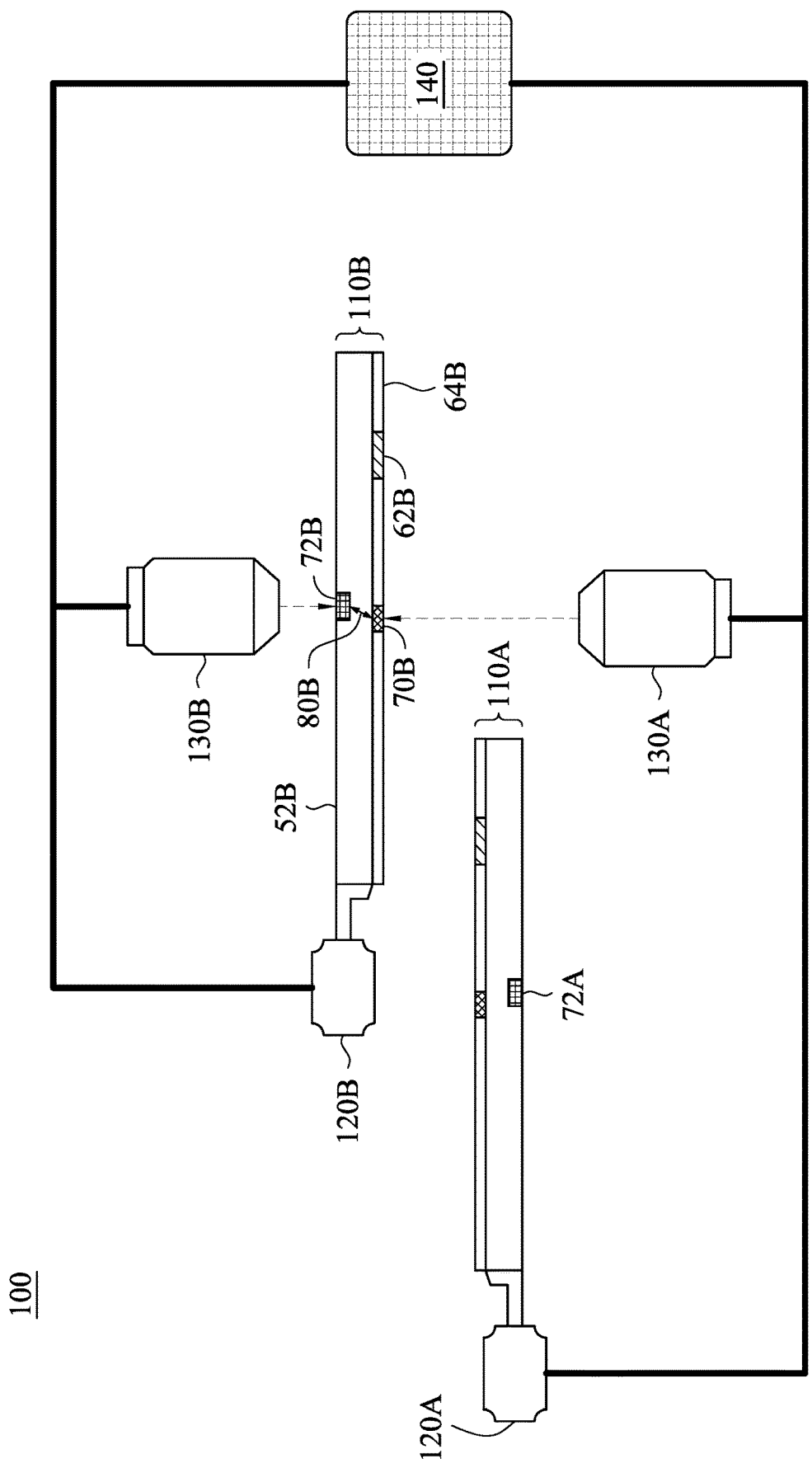

In FIG. 4, the first microscope 130A detects the location of the front-side alignment mark 70B of the second semiconductor device 110B, and the second microscope 130B detects the location of the back-side alignment mark 72B of the second semiconductor device 110B. This corresponds to steps 608 and 610 of the process flow 600 shown in FIG. 25. In some embodiments, the first semiconductor device 110A may be retracted by the first holder 120A in order to allow the first microscope 130A to detect the front-side alignment mark 70B without being blocked by the first semiconductor device 110A, as shown in FIG. 4. In some embodiments, a second offset 80B between the front-side alignment mark 70B and the back-side alignment mark 72B is determined based on the detected locations of the alignment marks 70B/72B. This corresponds to step 612 of the process flow 600 shown in FIG. 25. The second offset 80B may be similar to the first offset 80A described previously, but for the alignment marks 70B/72B of the second semiconductor device 110B. The locations of the alignment marks 70B/72B of the second semiconductor device 110B may be detected before detecting the locations of the alignment marks 70A/72A of the first semiconductor device 110A, in some embodiments. In some embodiments, the location of a device feature at or near the front side of the second semiconductor device 110B is detected instead of the location of a front-side alignment mark 70B, described in greater detail for FIGS. 8-9.

Figure 5:
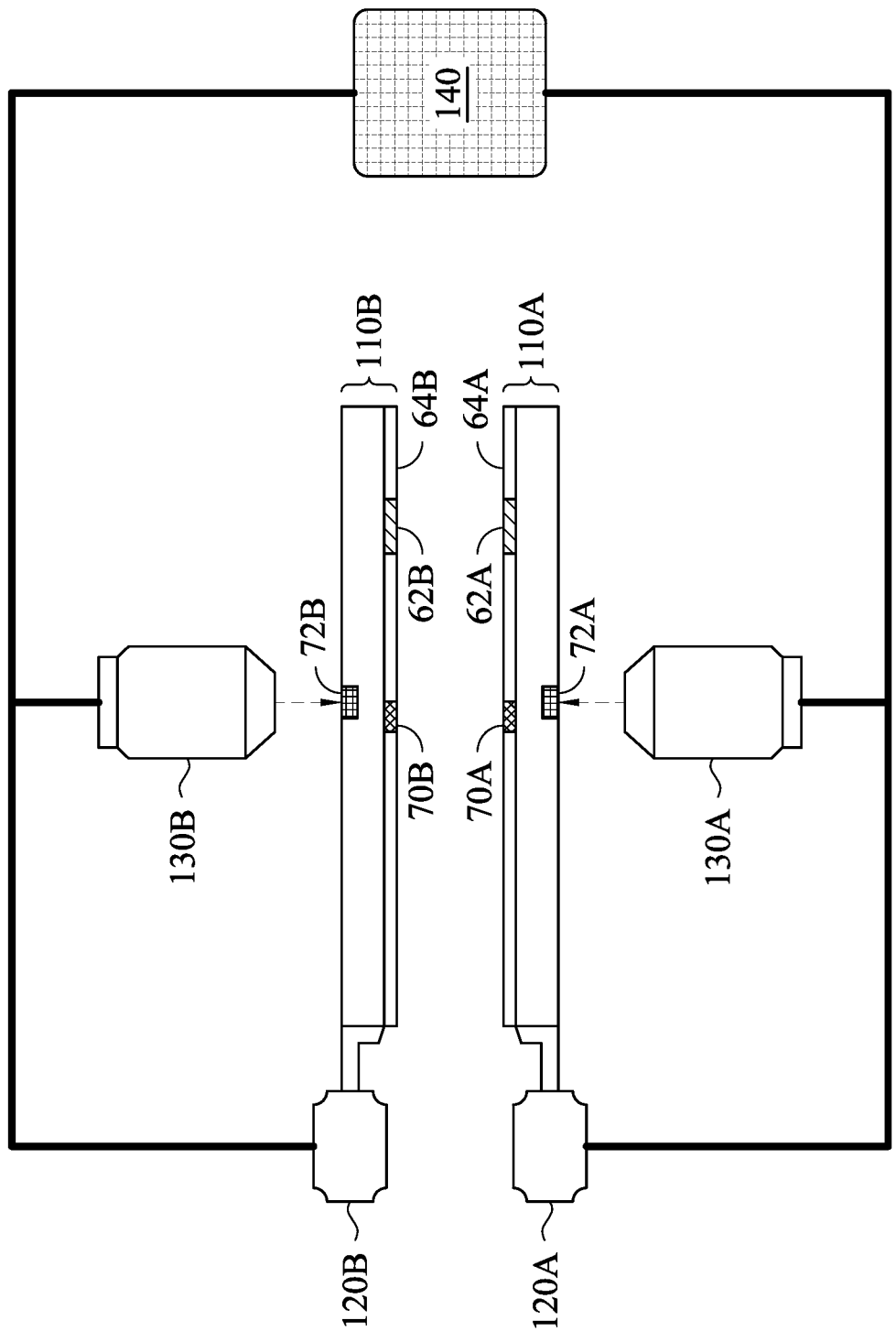

In FIG. 5, the first semiconductor device 110A and the second semiconductor device 110B are aligned for subsequent bonding, in accordance with some embodiments. This corresponds to step 614 of the process flow 600 shown in FIG. 25. In some embodiments, the semiconductor devices 110A-B are aligned by aligning the front-side alignment marks 70A-B. For example, the semiconductor devices 110A-B may be aligned such that the front-side alignment marks 70A of the first semiconductor device 110A are aligned with corresponding front-side alignment marks 70B of the second semiconductor device 110B. In some embodiments, the semiconductor devices 110A-B are aligned such that the conductive pads 62A of the first semiconductor device 110A are aligned with corresponding conductive pads 62B of the second semiconductor device 110B. In some cases, aligning the front-side alignment marks 70A-B may result in an alignment of the conductive pads 62A-B. The front-side alignment marks 70A-B may be aligned using the first offset 80A and the second offset 80B, described in greater detail below.

Alignment of the semiconductor devices 110A-B includes controlling the holders 120A-B to adjust the positions of the semiconductor devices 110A-B. For example, the controller 140 may send signals to the holders 120A-B that instruct the holders 120A-B to move the semiconductor devices 110A-B to particular positions. One or both of the semiconductor devices 110A-B may be repositioned during the alignment process. In some cases, the first semiconductor device 110A may remain approximately stationary (e.g., at a fixed position) while the second semiconductor device 110B is moved into alignment, and in other cases, the second semiconductor device 110B may remain approximately stationary while the first semiconductor device 110A is moved into alignment. In some cases, both semiconductor devices 110A-B are moved (e.g., continuously or intermittently) during the alignment process.

In some embodiments, the semiconductor devices 110A-B are aligned by determining the locations of the front-side alignment marks 70A-B based on the locations of the back-side alignment marks 72A-B. For example, during alignment, the locations of the back-side alignment marks 72A-B may be detected (e.g., once, periodically, or continuously) by the microscopes 130A-B and, using the offsets 80A-B, the locations of the front-side alignment marks 70A-B may be determined as described previously. In this manner, the location of the front-side alignment mark 70A may be determined from the detected location of the back-side alignment mark 72A, and the location of the front-side alignment mark 70B may be determined from the detected location of the back-side alignment mark 72B. The semiconductor devices 110A-B may then be repositioned such that the front-side alignment marks 70A-B are aligned, based on the detected locations of the back-side alignment marks 72A-B. In other words, the front-side alignment marks 70A-B may be aligned by repositioning the semiconductor devices 110A-B such that the back-side alignment marks 72A-B are in locations corresponding to the front-side alignment marks 70A-B being aligned.

Figure 6:
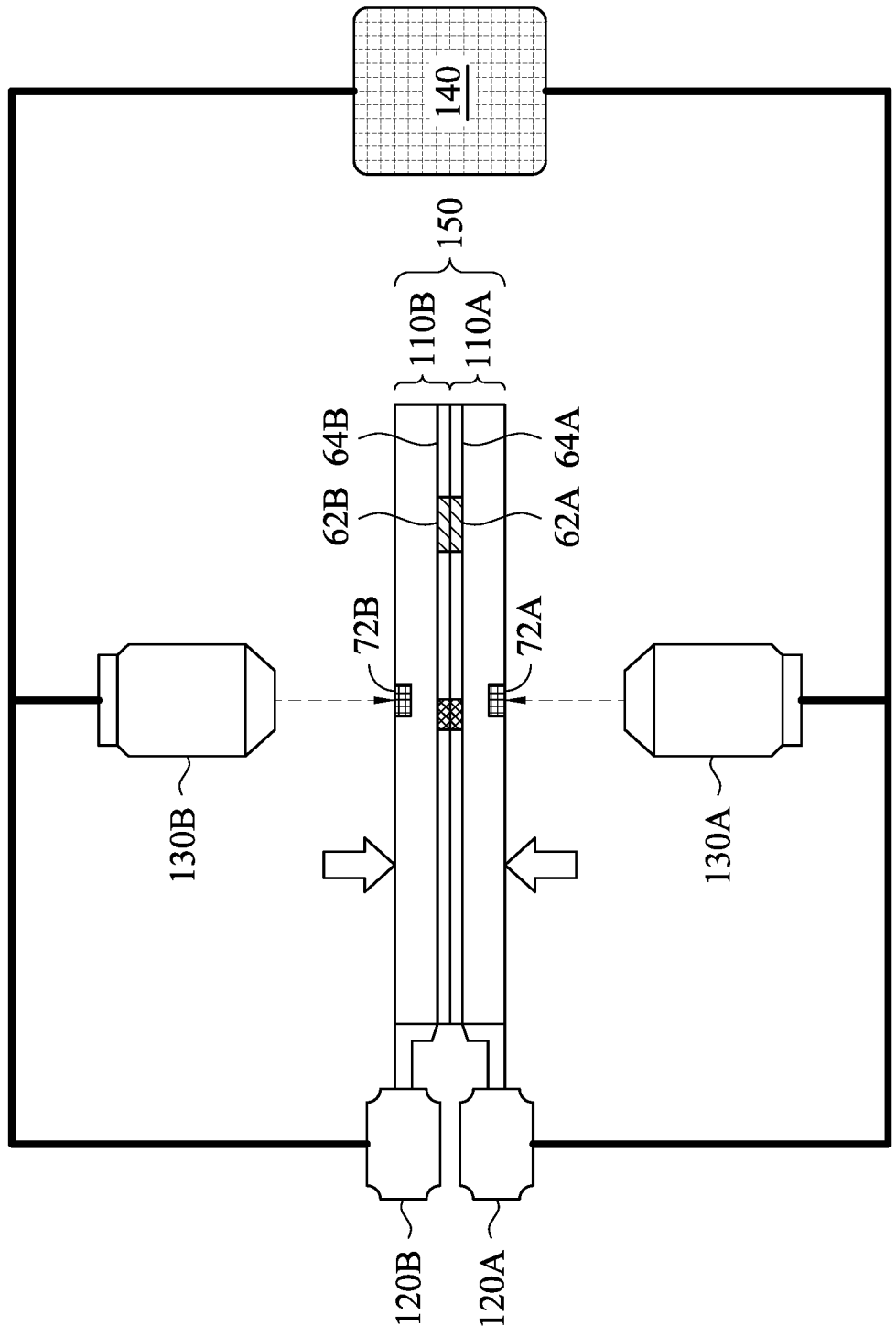
Figure 7:
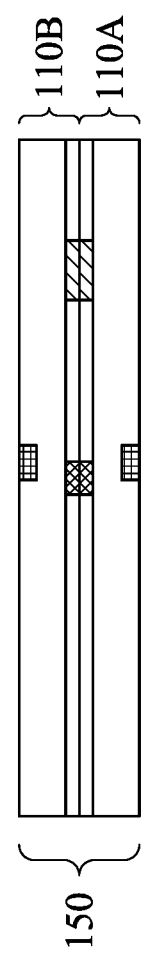

By aligning the front-side alignment marks 70A-B using the detected locations of the back-side alignment marks 72 as described herein, the alignment of the semiconductor devices 110A-B may be improved during manufacture of a bonded structure 150 (see FIGS. 6-7). For example, the overlay shift between the semiconductor devices 110A-B may be reduced. In some cases, the techniques described herein may allow for an alignment tolerance of within about ±100 nm. Other tolerances, including smaller tolerances, are possible. In this manner, the techniques described herein may allow for improved yield and device performance due to improved bonding.

Turning to FIG. 6, a bonding process is performed to bond the second semiconductor device 110B to the first semiconductor device 110A, in accordance with some embodiments. This corresponds to step 616 of the process flow 600 shown in FIG. 25. The bonding process may be, for example, chip-to-chip bonding, wafer-to-wafer bonding, chip-to-wafer bonding, substrate-to-substrate bonding, or another type of bonding process. In some embodiments, the bonding process may comprise metal-to-metal bonding, such as metal-to-metal direct bonding, copper-to-copper bonding, or the like. For example, the conductive pads 62A of the first semiconductor device 110A may be bonded to corresponding conductive pads 62B of the second semiconductor device 110B. In some embodiments, the bonding process may comprise direct surface bonding, such as fusion bonding, dielectric-to-dielectric bonding, oxide-to-oxide bonding, substrate-to-substrate bonding, non-metal-to-non-metal bonding, polymer-to-polymer bonding, flexible substrate-to-flexible substrate bonding, or the like. For example, the surface dielectric layer 64A of the first semiconductor device 110A may be bonded to the surface dielectric layer 64B of the second semiconductor device 110B. In some embodiments, the bonding process is a hybrid bonding process comprising at least two types of bonding, such as metal-to-metal bonding and non-metal-to-non-metal bonding, or the like. For example, the surface dielectric layers 64A-B may be bonded together and the conductive pads 62A-B may be bonded together.

In some embodiments, before performing the bonding process, a surface treatment is performed on the first semiconductor device 110A and/or the second semiconductor device 110B. In some embodiments, surface treatment includes performing an activation process on bonding surfaces (e.g., the surface dielectric layers 64A-B and/or the conductive pads 62A-B) of the semiconductor devices 110A-B that may include, for example, a dry treatment, a wet treatment, a plasma treatment, exposure to an inert gas, exposure to $H_2$, exposure to $N_2$, exposure to $O_2$, the like, or combinations thereof. However, any suitable activation process may be utilized. After the activation process, the first semiconductor device 110A and/or the second semiconductor device 110B may be cleaned using, e.g., a chemical rinse.

Once aligned, the first semiconductor device 110A and the second semiconductor device 110B are brought into contact using the first holder 120A and/or the second holder 120B. In some embodiments, the microscopes 130A-B continuously or repeatedly detect the locations of the back-side alignment marks 72A-B as the semiconductor devices 110A-B are brought into contact, and the positions of the semiconductor devices 110A-B may be adjusted based on the detected locations of the back-side alignment marks 72A-B. In this manner, the alignment of the semiconductor devices 110A-B may be monitored and adjusted during the bonding process to reduce overlay shift and improve yield. For example, by monitoring the alignment of the semiconductor devices 110A-B, shifting due to movement of the holders 120A-B may be detected, and the semiconductor devices 110A-B may be repositioned to correct for the movement. This can improve the alignment of the semiconductor devices 110A-B during a bonding process.

In some embodiments, the semiconductor devices 110A-B may then be subjected to a thermal treatment and/or pressed against each other (e.g., by applying contact pressure) to the semiconductor devices 110A-B. For example, semiconductor devices 110A-B may be subjected to a pressure of about 200 kPa or less, and to a temperature between about 200° C. and about 400° C. The semiconductor devices 110A-B may then be subjected to a temperature at or above the eutectic point of the material of the conductive pads 62A-B (e.g., between about 150° C. and about 650° C.) to fuse the conductive pads 62A. In this manner, the dielectric-to-dielectric bonding and/or metal-to-metal bonding of the semiconductor devices 110A-B forms a bonded structure 150. In some embodiments, the bonded structure 150 is baked, annealed, pressed, or otherwise treated to strengthen or finalize the bonds.

In some embodiments, after performing the bonding process, the alignment of the semiconductor devices 110A-B of the bonded structure 150 may be measured using the bonding system 100. This corresponds to optional step 618 of the process flow 600 shown in FIG. 25. For example, the bonded structure 150 may be inspected to measure any misalignment or overlay shift of the semiconductor devices 110A-B. In some embodiments, the locations of the back-side alignment marks 72A-B on the bonded structure 150 may be measured by the microscopes 130A-B, and the misalignment may be determined from the relative locations of the back-side alignment marks 72A-B. For example, the locations of the front-side alignment marks 70A-B within the bonded structure 150 may be determined from the measured locations of the back-side alignment marks 72A-B, and the misalignment of the semiconductor devices 110A-B may determined from the misalignment of the front-side alignment marks 70A-B. Other techniques are possible. In some embodiments, by measuring the alignment after forming the bonded structure 150, good devices may be identified with greater efficiency. For example, after measuring the misalignment, the bonded structures 150 or portions of a bonded structure 150 (e.g., regions to be singulated) that are within an alignment tolerance may be subsequently processed or tested. This can reduce the amount of additional testing or inspection performed to identify known good die (KGD), good bonded structures 150, or the like. Identifying good devices more efficiently can reduce manufacturing time and manufacturing cost.

FIG. 7 illustrates a cross-sectional view of a bonded structure 150, in accordance with some embodiments. The bonded structure 150 may be subsequently processed using suitable techniques. For example, in some embodiments, a singulation process may be performed to singulate multiple devices formed in the bonded structure 150 into separate devices. The singulation process may include a sawing process, a laser process, or the like.

Figure 8:
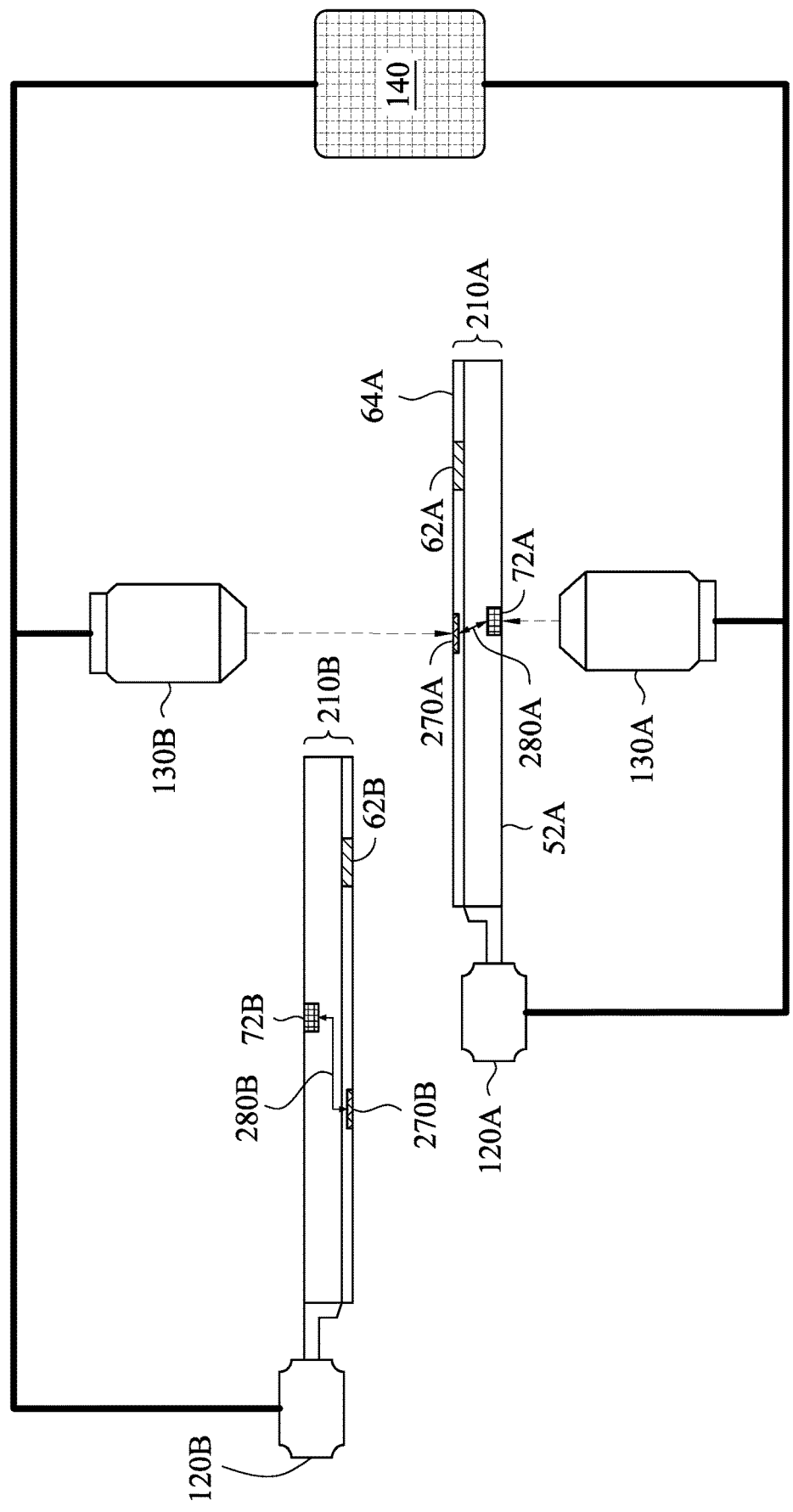
FIGS. 8 and 9 illustrate cross-sectional views of intermediate steps during a process for forming a bonded structure in accordance with some embodiments.
Figure 9:
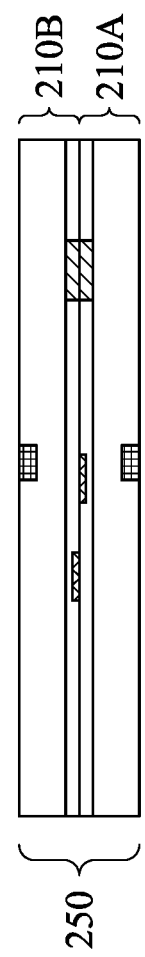

FIGS. 8 and 9 illustrate intermediate steps in the bonding of semiconductor devices 210A-B to form a bonded structure 250, in accordance with some embodiments. FIG. 8 shows a first semiconductor device 210A and a second semiconductor device 210B in a bonding system 100, in accordance with some embodiments. The bonding system 100 may be similar to the bonding system 100 described for FIG. 2. The semiconductor devices 210A-B are similar to the semiconductor devices 110A-B described previously, except that the semiconductor devices 210A-B do not include front-side alignment marks that are used for alignment during the bonding process. In other embodiments, one of the semiconductor devices 210A-B may include a front-side alignment mark (e.g., similar to front-side alignment marks 70A-B) that is used for alignment during the bonding process. In some embodiments, the semiconductor devices 210A-B include back-side alignment marks 72A-B, which may be similar to the back-side alignment marks 72A-B described previously.

The semiconductor devices 210A-B also include device features 270A-B, in some embodiments. The device features 270A-B may be functional or dummy features of the semiconductor devices 210A-B, and may be located at or near the front side of the semiconductor devices 210A-B. For example, the device features 270A-B may comprise conductive features (e.g., lines, vias, or the like), conductive pads, passive devices, active devices, isolating structures, combinations thereof, or the like, which may include features or structures described previously for the semiconductor device 50 shown in FIG. 1.

FIG. 8 illustrates an intermediate step of a bonding process, in accordance with some embodiments. The step shown in FIG. 8 may be similar to the step shown in FIG. 3A. For example, FIG. 8 shows the first microscope 130A detecting the location of the back-side alignment mark 72A of the first semiconductor device 210A. However, as shown in FIG. 8, the second microscope 130B detects a location of the device feature 270A of the first semiconductor device 210A instead of a location of a front-side alignment mark of the first semiconductor device 210A. Accordingly, a first offset 280A is determined between a location of the device feature 270A and a location of the back-side alignment mark 72A of the first semiconductor device 210A. The first offset 280A may correspond to a difference between a detected location of the device feature 270A and a detected location of the back-side alignment mark 72A. In this manner, the first offset 280A may be similar to the first offset 80A described for FIGS. 3A-B, but for an offset between the back-side alignment mark 72A and a device feature 270A. For example, the location of the back-side alignment mark 72A and the first offset 280A may be used to determine the location of the device feature 270A.

In some embodiments, a location of the back-side alignment mark 72B of the second semiconductor device 210B may be detected using the second microscope 130B, and a location of the device feature 270B of the second semiconductor device 210B may be detected using the first microscope 130A. This may be similar to the step shown previously in FIG. 4. Additionally, a second offset 280B may be determined between a location of the device feature 270B and a location of the back-side alignment mark 72B of the second semiconductor device 210B.

After determining the locations of the back-side alignment marks 72A-B, the locations of the device features 270A-B, and the offsets 280A-B, the semiconductor devices 210A-B may be bonded using a bonding process to form a bonded structure 250, in accordance with some embodiments. A bonded structure 250 is shown in FIG. 9, and may be similar to the bonded structure 150 described previously. The bonding process may be similar to the bonding process described for FIG. 6, except that the semiconductor devices 210A-B are aligned according to the locations of the device features 270A-B instead of according to the locations of the front-side alignment marks 70A-B. For example, the locations of the device features 270A-B may be determined based on the measured locations of the back-side alignment marks 72A-B and the offsets 280A-B, and the semiconductor devices 210A-B may be repositioned to achieve appropriate alignment of the device features 270A-B. For example, in some cases the semiconductor devices 210A-B may be aligned such that the device features 270A-B are bonded together during the bonding process. In other cases, the device features 270A-B are not bonded together, as shown in the embodiment of FIGS. 8-9. In some cases, the use of device features for alignment instead of front-side alignment marks can increase the available area of the semiconductor device that may be utilized for forming device features. In this manner, the density of features formed in a semiconductor device may be increased, and the design of a semiconductor device may have more flexibility.

Figure 10:
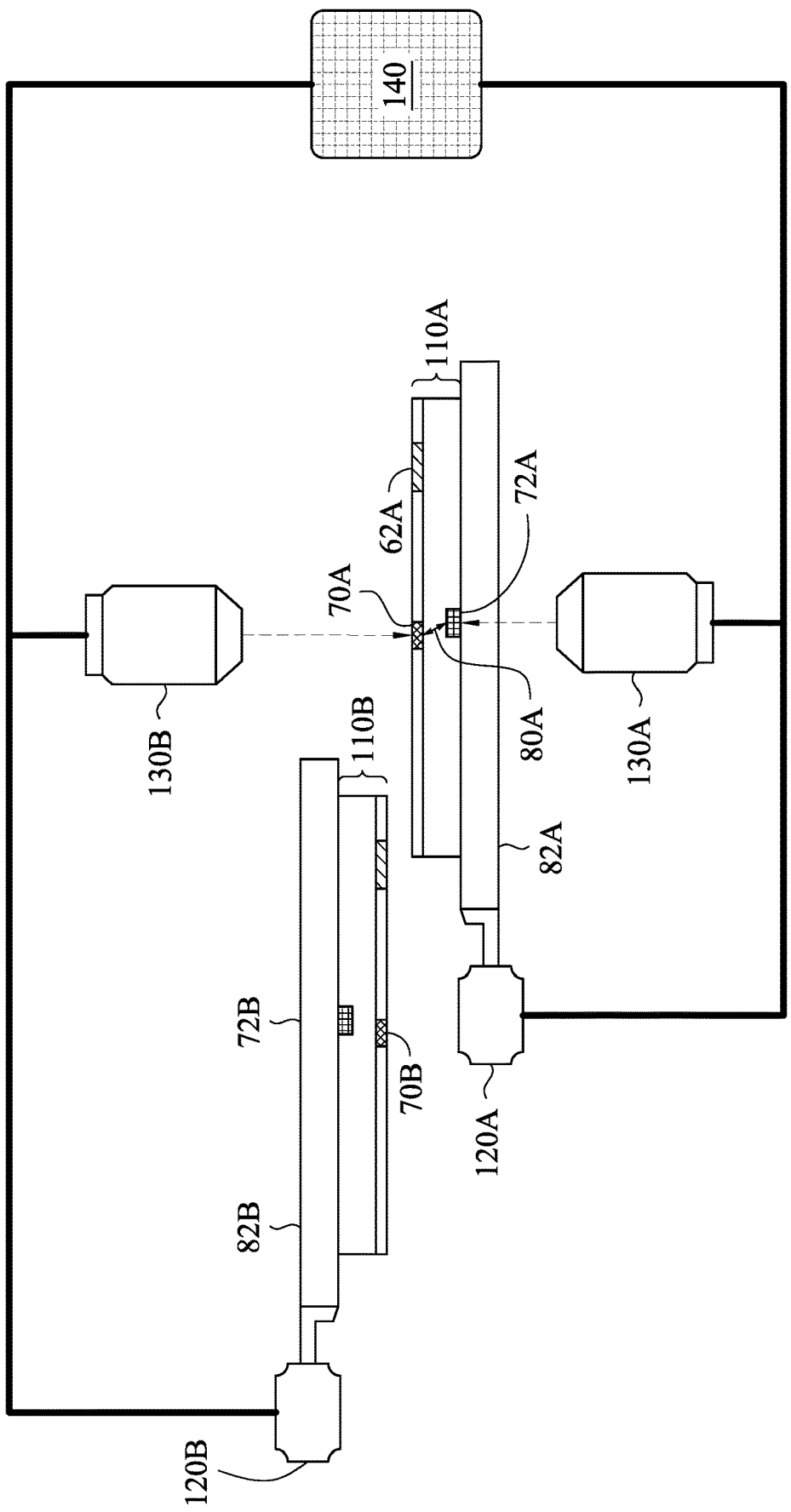
FIGS. 10, 11, and 12 illustrate cross-sectional views of intermediate steps during a process for forming a bonded structure in accordance with some embodiments.
Figure 11:
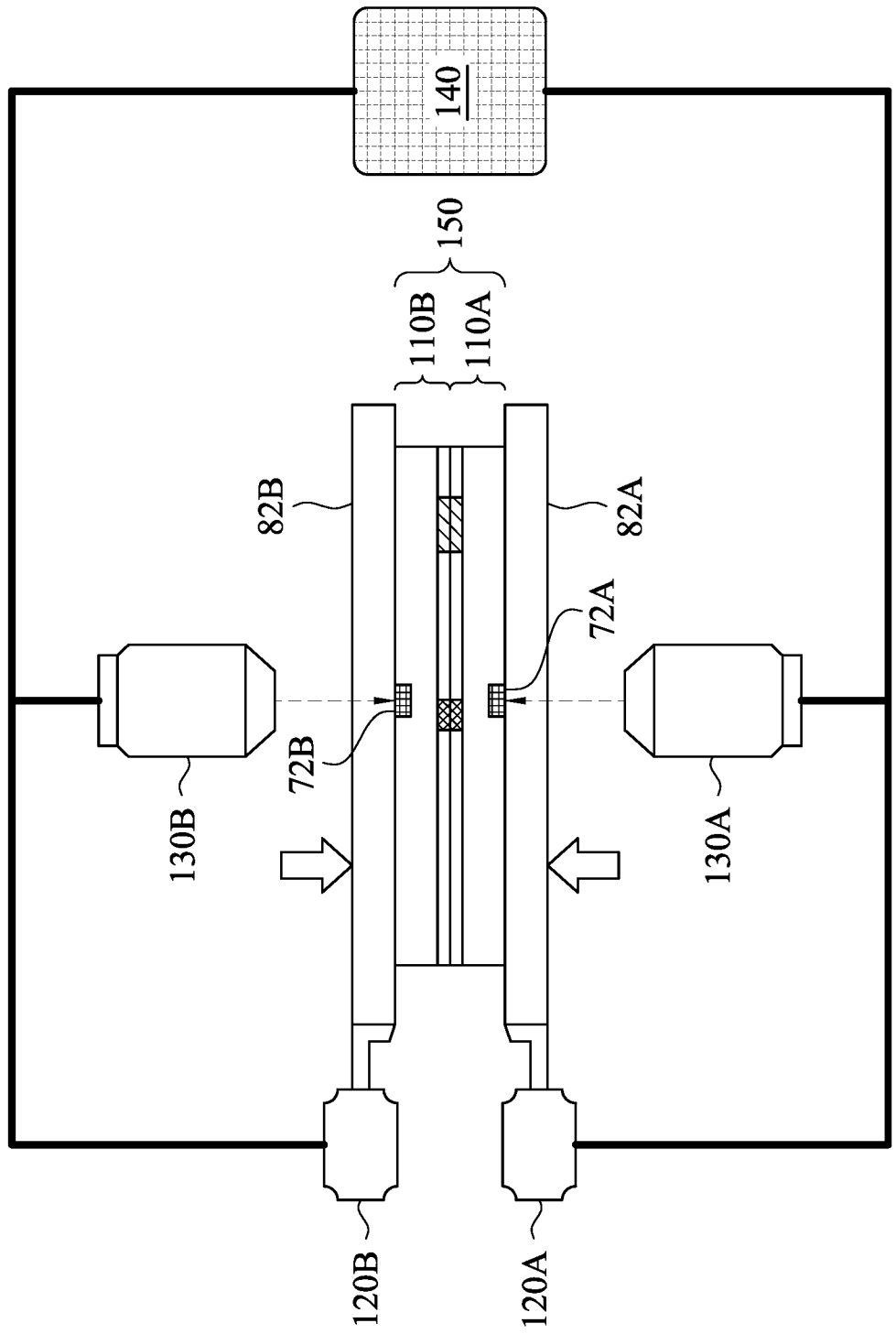
Figure 12:
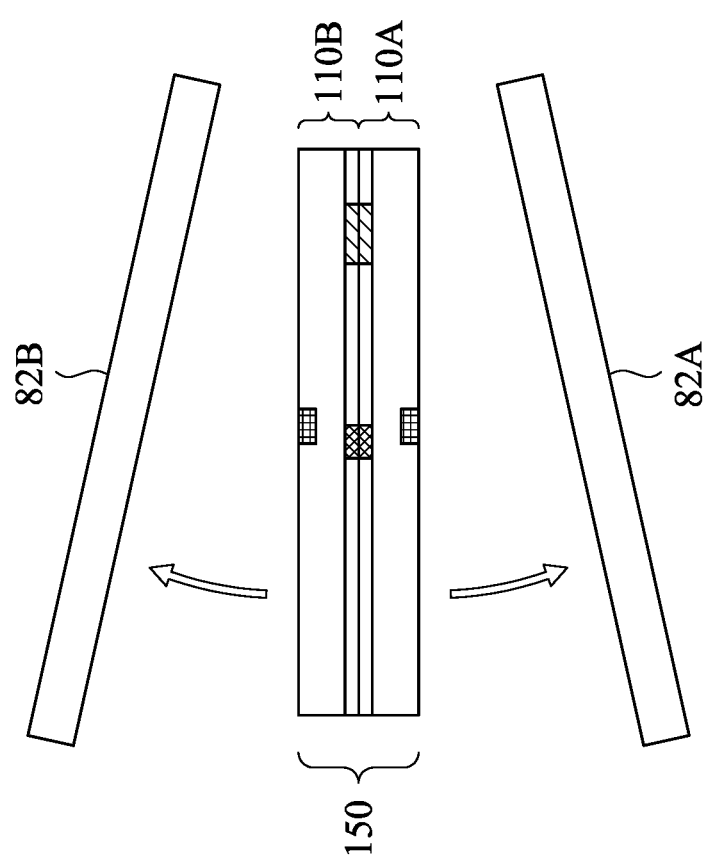

FIGS. 10, 11, and 12 illustrate intermediate steps in the bonding of semiconductor devices 110A-B to form a bonded structure 150, in accordance with some embodiments. The bonding process shown in FIGS. 10-12 is similar to the bonding process shown in FIGS. 3A-7, except that the semiconductor devices 110A-B are attached to carrier substrates 82A-B prior to performing the bonding process. For example, the first semiconductor device 110A is attached to the carrier substrate 82A and the second semiconductor device 110B is attached to the carrier substrate 82B. In other embodiments, only one of the semiconductor devices 110A-B is attached to a carrier substrate.

In some embodiments, the carrier substrates 82A-B are formed from a material that is at least partially transparent to visible light. In some embodiments, the carrier substrates 82A-B may be a material that is at least partially transparent to other wavelengths of light, such as infrared light or ultraviolet light. The carrier substrates 82A-B may include, for example, a glass material, silicon oxide, plastic, another transparent material, the like, or a combination thereof. In some embodiments, the carrier substrates 82A-B may be panel structures, which may include, for example, a supporting substrate formed from a suitable dielectric material, such as a glass material, a plastic material, or an organic material. The panel structure may be, for example, a rectangular panel. In some cases, the use of carrier substrates 82A-B may provide structural support for the semiconductor devices 110A-B, improve planarity of the semiconductor devices 110A-B, or reduce warping of the semiconductor devices 110A-B.

In some embodiments, each semiconductor device 110A-B may be attached to its corresponding carrier substrate 82A-B by an adhesive or the like (not illustrated in the figures). In some embodiments, the adhesive may be a release layer that facilitates subsequent removal of the carrier substrates 82A-B. The release layer may be formed of a polymer-based material, which may be removed along with the carrier substrates 82A-B. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto each carrier substrate 82A-B, or the like.

FIG. 10 shows the first microscope 130A detecting the location of the back-side alignment mark 72A of the first semiconductor device 110A and the second microscope 130B detecting the location of the front-side alignment mark 70A of the first semiconductor device 110A, in accordance with some embodiments. Due to the carrier substrate 82A being transparent, the first microscope 130A is able to detect the location of the back-side alignment mark 72A even though the carrier substrate 82A is between the first microscope 130A and the back-side alignment mark 72A. A first offset 80A may be determined between the front-side alignment mark 70A and the back-side alignment mark 72A using techniques similar to those described previously for FIGS. 3A-B.

In a similar manner, the location of the back-side alignment mark 72B of the second semiconductor device 110B may be detected through the carrier substrate 82B by the second microscope 130B, and the location of the front-side alignment mark 70B of the first semiconductor device 110A may be detected by the first microscope 130A. A second offset 80B may be determined using techniques similar to those described previously for FIG. 4.

Turning to FIG. 11, after determining the locations of the front-side alignment marks 70A-B, the locations of the back-side alignment marks 72A-B, and the offsets 80A-B, the semiconductor devices 110A-B may be bonded using a bonding process to form a bonded structure 250, in accordance with some embodiments. The bonding process may be similar to the bonding process described for FIG. 6. For example, the semiconductor devices 110A-B may be aligned by detecting the locations of the back-side alignment marks 72A-B, using the offsets 80A-B to determine the locations of the front-side alignment marks 70A-B, and then repositioning the semiconductor devices 110A-B as needed to align the front-side alignment marks 70A-B. Once aligned, the semiconductor devices 110A-B may be brought into physical contact to bond the semiconductor devices 110A-B, as described previously. A bonded structure 150 is shown in FIG. 11, and may be similar to the bonded structure 150 described previously.

In FIG. 12, the carrier substrates 82A-B are detached (e.g., "de-bonded") from the bonded structure 150. In accordance with some embodiments, the de-bonding includes projecting a light such as a laser light or an UV light on the release layer so that the release layer decomposes under the heat of the light and the carrier substrates 82A-B can be removed. Other techniques for removing the carrier substrates 82A-B are possible. This corresponds to optional step 620 of the process flow 600 shown in FIG. 25.

Figure 13:
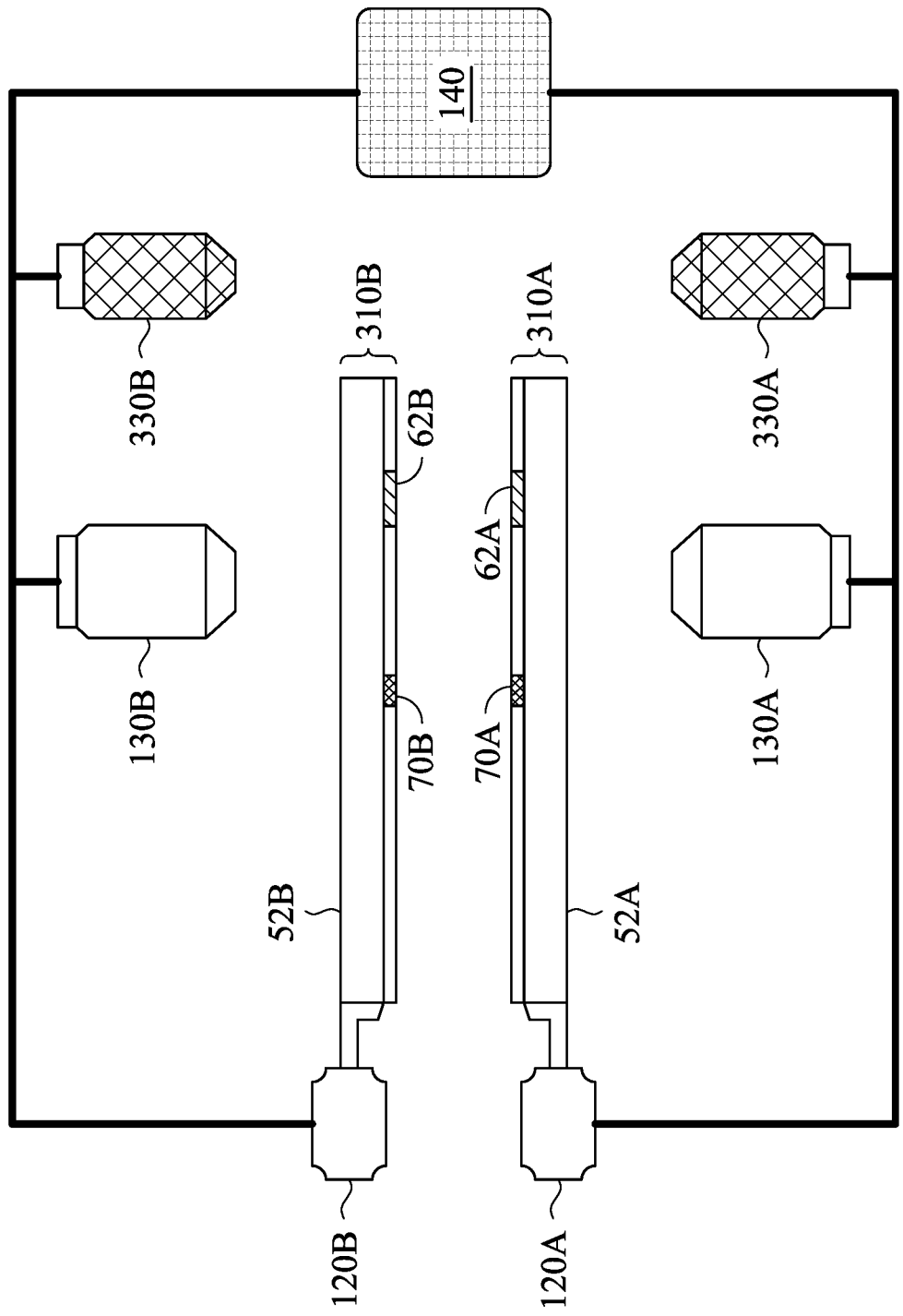
FIGS. 13, 14, 15, 16, 17, 18, and 19 illustrate cross-sectional views of intermediate steps during a process for forming a bonded structure in accordance with some embodiments.
Figure 26:
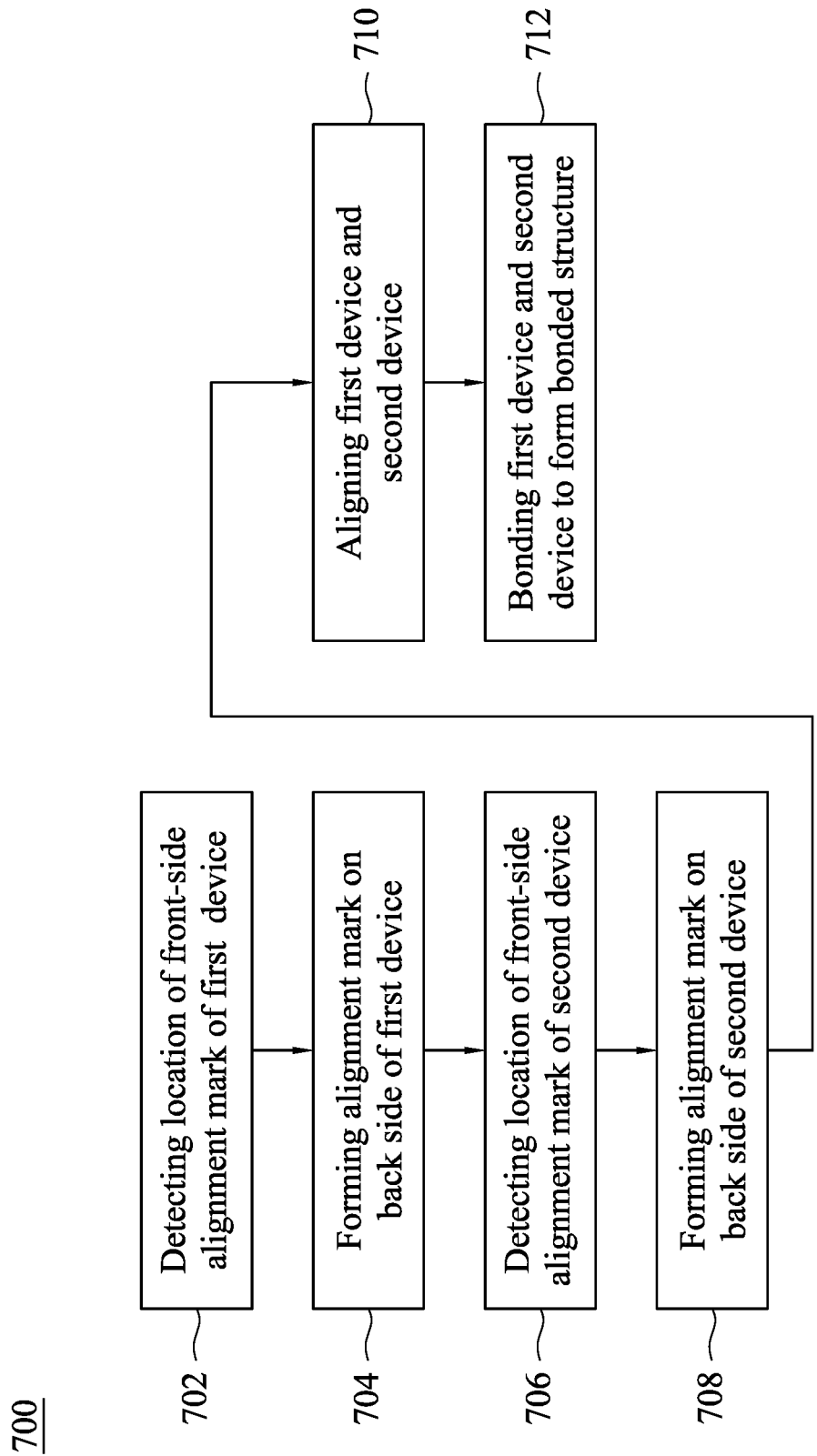
FIG. 26 illustrates a process flow for forming a bonded structure in accordance with some embodiments.

FIGS. 13 through 19 illustrate intermediate steps in the bonding of semiconductor devices 310A-B to form a bonded structure 350, in accordance with some embodiments. FIG. 13 shows a first semiconductor device 310A and a second semiconductor device 310B in a bonding system 300, in accordance with some embodiments. The bonding system 300 may be similar to the bonding system 100 described for FIG. 2, except that the bonding system 300 includes a first marking tool 330A and a second marking tool 330B, described in greater detail below. The semiconductor devices 310A-B may be similar to the semiconductor devices 110A-B described previously, except that the semiconductor devices 310A-B do not include back-side alignment marks used for alignment during the bonding process that have been formed prior to the bonding process. In other embodiments, one of the semiconductor devices 310A-B may include a back-side alignment mark (e.g., similar to back-side alignment marks 72A-B) that is used for alignment during the bonding process. Some of the steps shown in FIGS. 13-19 correspond to steps of the process flow 700 shown below in FIG. 26.

As stated above, the bonding system 300 may be similar to the bonding system 100 described for FIG. 2, except for the inclusion of marking tools 330A-B. The marking tools 330A-B may be devices that are configured to make an alignment mark on a semiconductor device. For example, the first marking tool 330A may be configured to make an alignment mark (e.g., first alignment mark 372A in FIG. 15) on the back side of the first semiconductor device 310A (e.g., on the semiconductor substrate 52A). Similarly, the second marking tool 330B may be configured to make an alignment mark (e.g., second alignment mark 372B in FIG. 17) on the back side of the second semiconductor device 310B (e.g., on the semiconductor substrate 52B). The marking tools 330A-B may make an alignment mark using, for example, a laser, an electron beam, another technique, or the like. The marking tools 330A-B of the bonding system 300 are shown as devices that are separate from the microscopes 130A-B, but in other embodiments the marking tools 330A-B may be incorporated within the microscopes 130A-B. The marking tools 330A-B may be connected to the controller 140, and may be configured to send signals to the controller 140 or receive signals from the controller 140.

Figure 14:
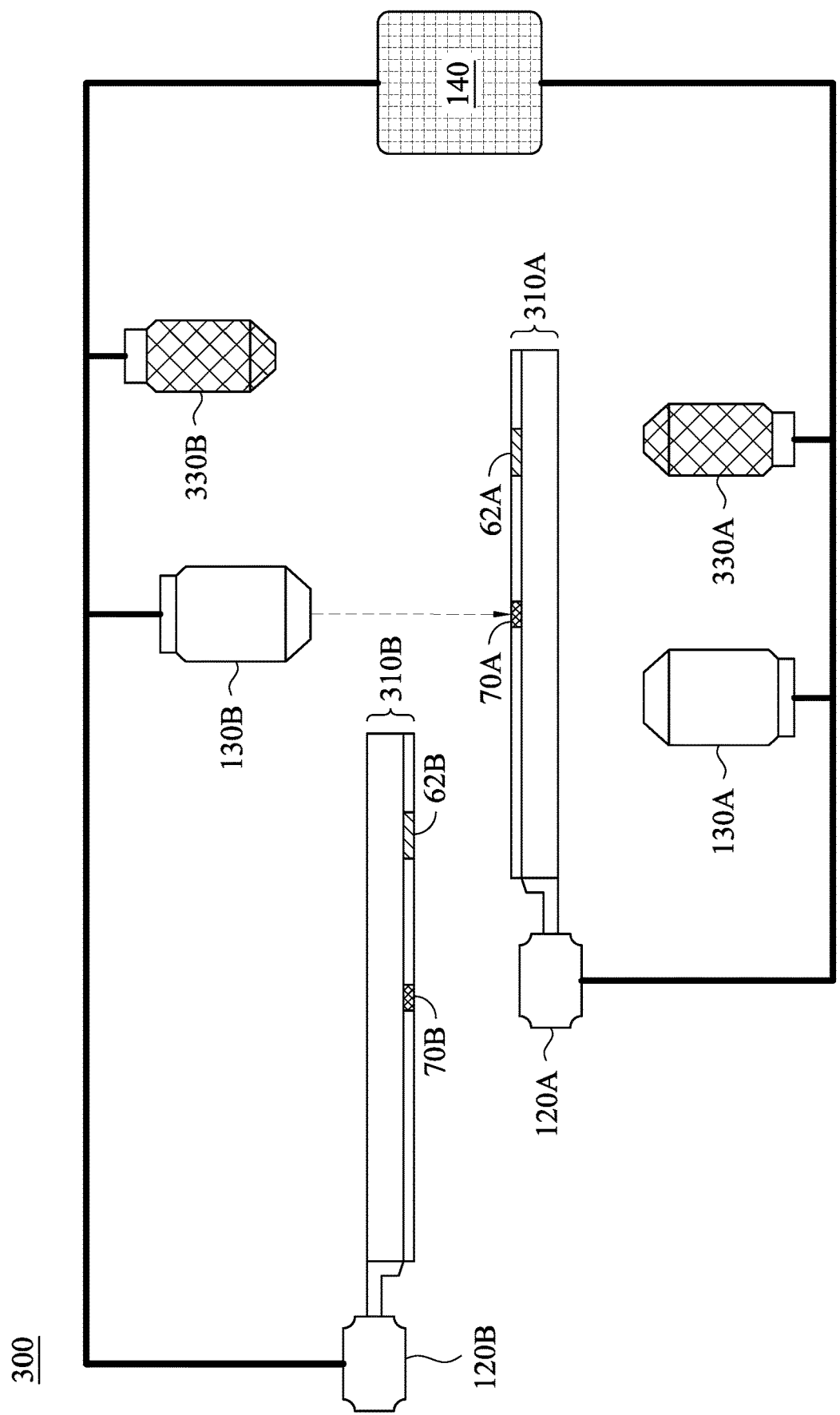
Figure 15:
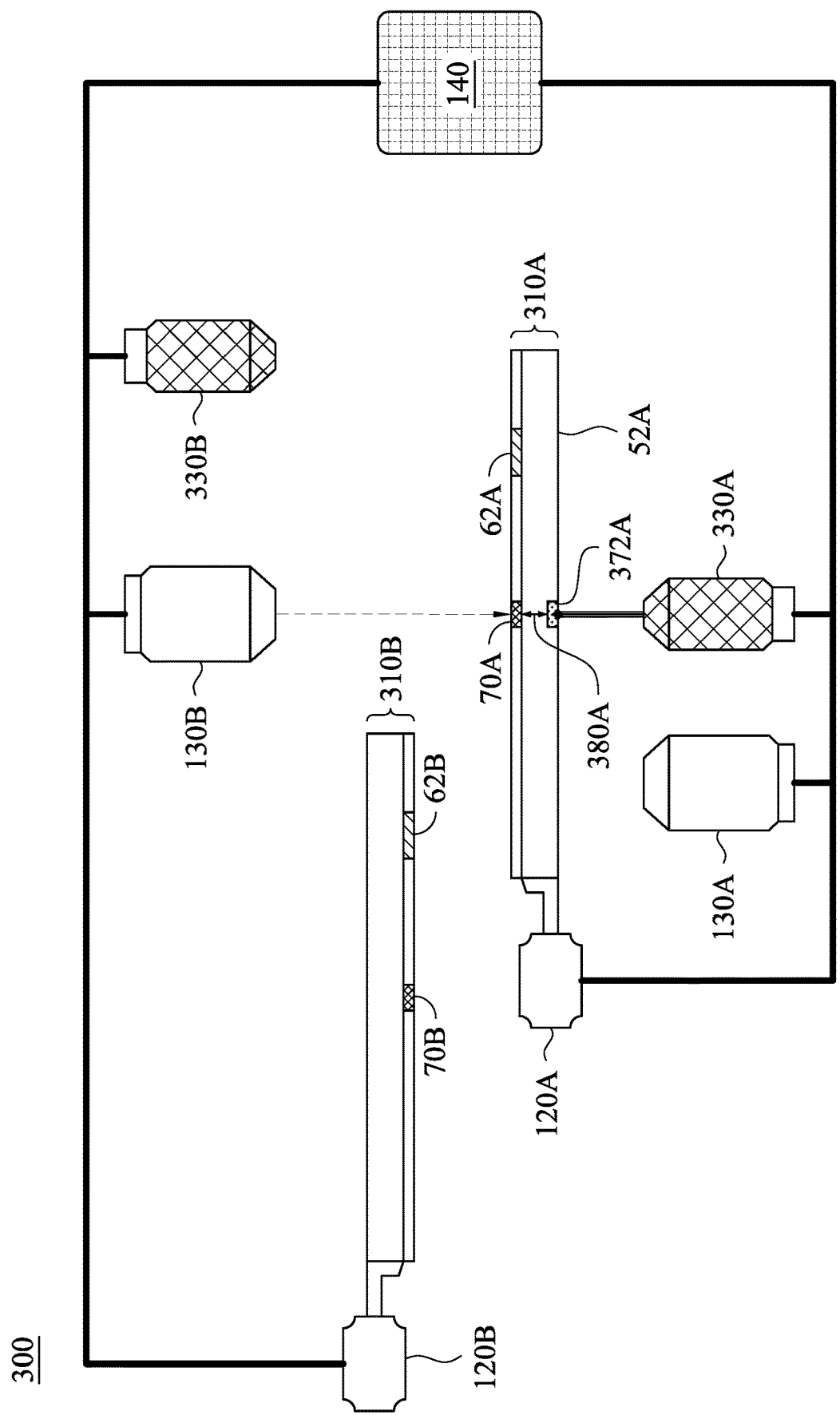

In FIG. 14, the second microscope 130B detects a location of the front-side alignment mark 70A of the first semiconductor device 310A, in accordance with some embodiments. This corresponds to step 702 of the process flow 700 shown in FIG. 26. In FIG. 15, the first marking tool 330A makes a first alignment mark 372A on the back side of the first semiconductor device 310A, in accordance with some embodiments. This corresponds to step 704 of the process flow 700 shown in FIG. 26. For example, the first alignment mark 372A may be made at or near the back-side surface of the semiconductor substrate 52A. In some embodiments, a first offset 380A may be determined between the front-side alignment mark 70A and the first alignment mark 372A. In some embodiments, the first offset 380A is determined prior to forming the first alignment mark 372A, and in other embodiments, the first offset 380A is determined after forming the first alignment mark 372A. In some embodiments, the first offset 380A may be determined using techniques similar to that described previously for the first offset 80A.

In some embodiments, the first alignment mark 372A is made at a location that is based on the measured location of the front-side alignment mark 70A. In some embodiments, the first alignment mark 372A may be made at a location that is approximately directly opposite the front-side alignment mark 70A. For example, the lateral offset of the first offset 380A may be approximately zero. In other embodiments, the location of the first alignment mark 372A may have a nonzero lateral offset from the front-side alignment mark 70A. In some embodiments, the first offset 380A may be predetermined, and the first alignment mark 372A made at a location that is approximately the first offset 380A from the measured location of the front-side alignment mark 70A. In some embodiments, the location of the first alignment mark 372A is detected (e.g., using the first microscope 130A) after forming the first alignment mark 372A, and the first offset 380A is determined from the detected location of the first alignment mark 372A. In some cases, forming a first alignment mark 372A based on a location of a front-side alignment mark 70A as described herein may allow for a more precise determination of the first offset 380A, and thus may allow for improved alignment of the semiconductor devices 310A-B during the bonding process. For example, forming a alignment mark 372A within the bonding system 300 as described can reduce the chance of increased misalignment due to mechanically moving the first semiconductor device 310A before or during the bonding process.

Figure 16:
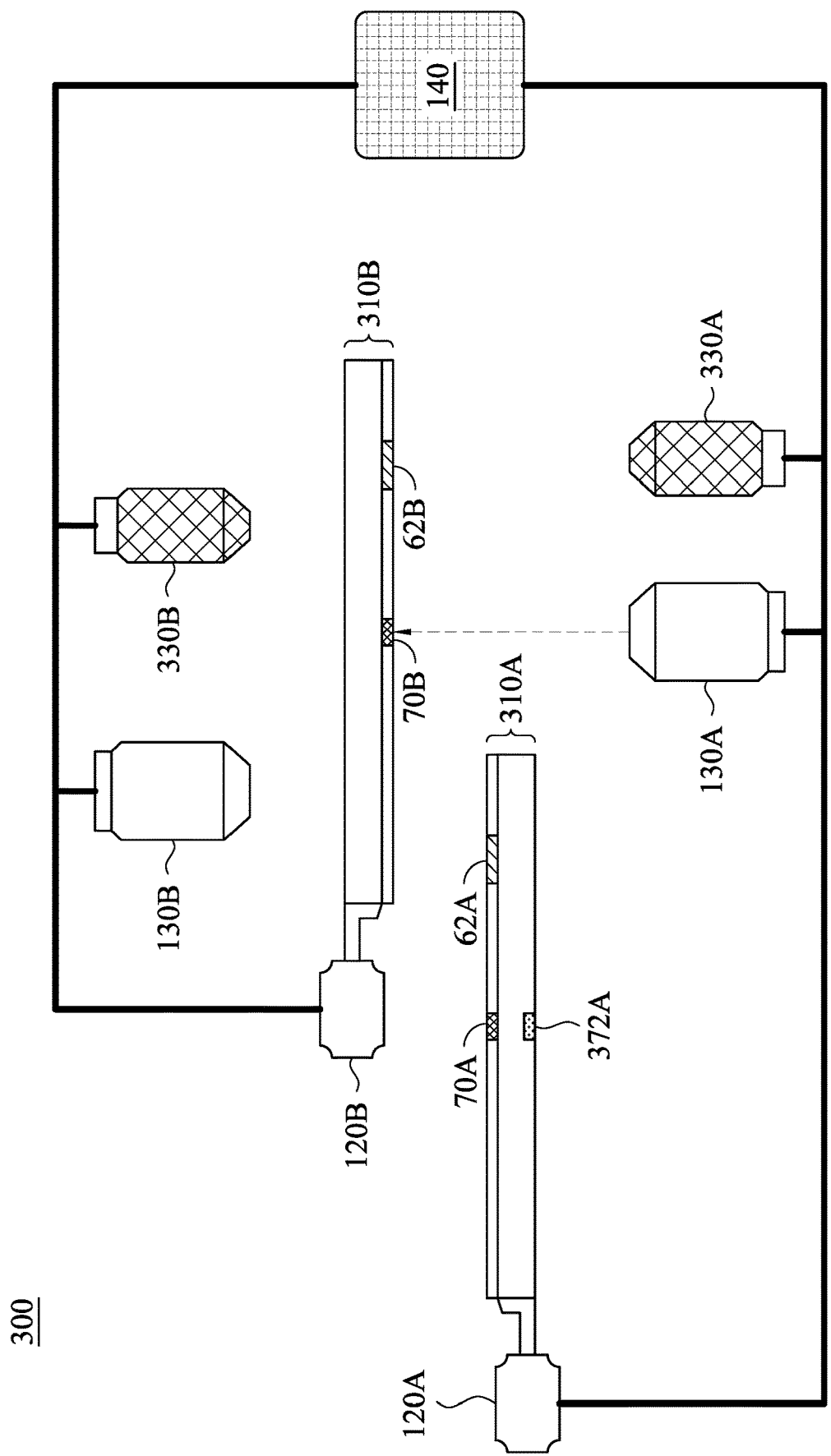
Figure 17:
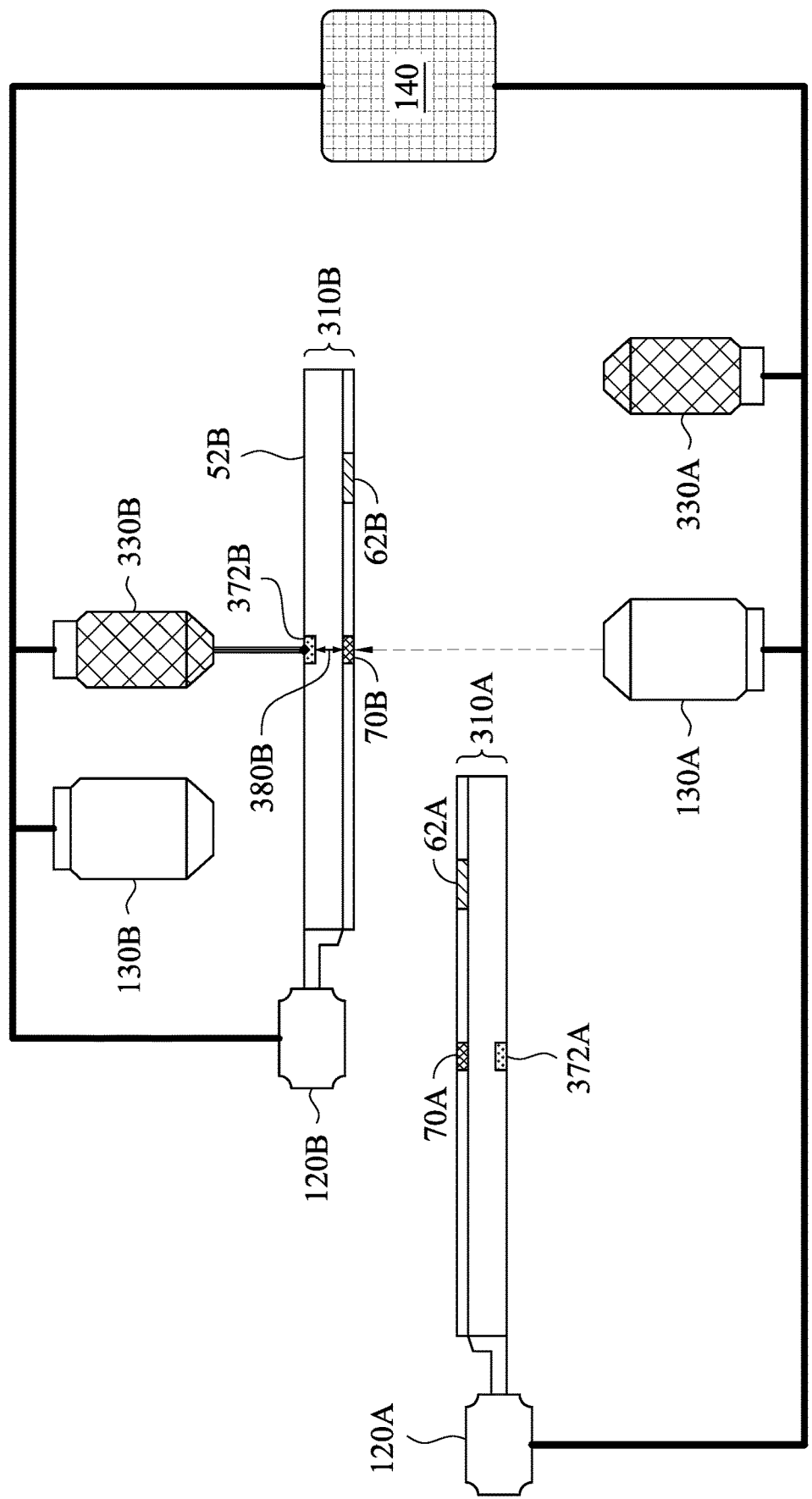

In FIG. 16, the first microscope 130A detects a location of the front-side alignment mark 70B of the second semiconductor device 310B, in accordance with some embodiments. This corresponds to step 706 of the process flow 700 shown in FIG. 26. In other embodiments, the location of the front-side alignment mark 70B may be detected before detecting the location of the front-side alignment mark 70A (see FIG. 14) or before forming the first alignment mark 372A (see FIG. 15). In FIG. 17, the second marking tool 330B makes a second alignment mark 372B on the back side of the second semiconductor device 310B, in accordance with some embodiments. This corresponds to step 708 of the process flow 700 shown in FIG. 26. The second alignment mark 372B may be similar to the first alignment mark 372A and may be formed using similar techniques. For example, the second alignment mark 372B may be made at or near the back-side surface of the semiconductor substrate 52B. In some embodiments, a second offset 380B may be determined between the front-side alignment mark 70B and the second alignment mark 372B. In some embodiments, the second offset 380B is determined prior to forming the second alignment mark 372B, and in other embodiments, the second offset 380B is determined after forming the second alignment mark 372B. The second offset 380B may be determined using techniques similar to that described for the first offset 380A. The second alignment mark 372B may be made at a location that is based on the measured location of the front-side alignment mark 70B, in some embodiments. In some embodiments, the location of the second alignment mark 372B may be detected (e.g., by the second microscope 130B) after formation, and the second offset 380B may be determined from the detected location. In other embodiments, the second alignment mark 372B may be formed before detecting the location of the front-side alignment mark 70A (see FIG. 14) or before forming the first alignment mark 372A (see FIG. 15).

Figure 18:
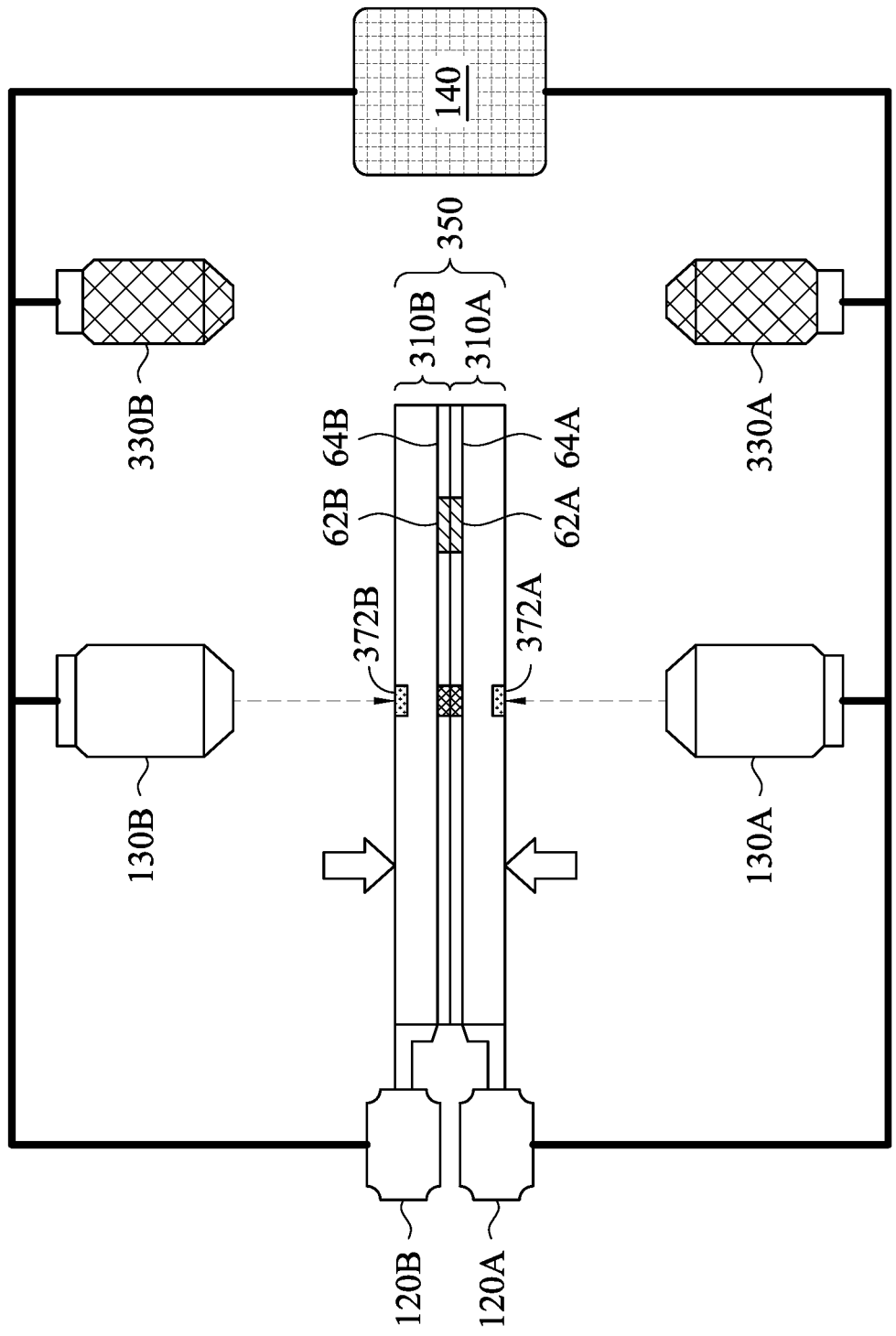
Figure 19:
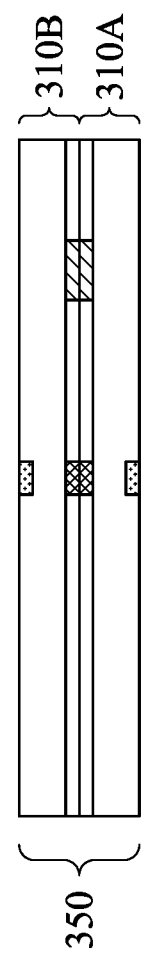

Turning to FIG. 18, after determining the locations of the front-side alignment marks 70A-B, forming the alignment marks 372A-B, and determining any offsets 380A-B, the semiconductor devices 310A-B may be bonded using a bonding process to form a bonded structure 350, in accordance with some embodiments. This corresponds to steps 710 and 712 of the process flow 700 shown in FIG. 26. The bonding process may be similar to the bonding process described for FIG. 6. For example, the semiconductor devices 310A-B may be aligned by detecting the locations of the alignment marks 372A-B, using the offsets 380A-B to determine the locations of the front-side alignment marks 70A-B, and then repositioning the semiconductor devices 310A-B as needed to align the front-side alignment marks 70A-B. Once aligned, the semiconductor devices 310A-B may be brought into physical contact to bond the semiconductor devices 310A-B, as described previously. A bonded structure 150 is shown in FIG. 19, and may be similar to the bonded structure 350 described previously.

Figure 20:
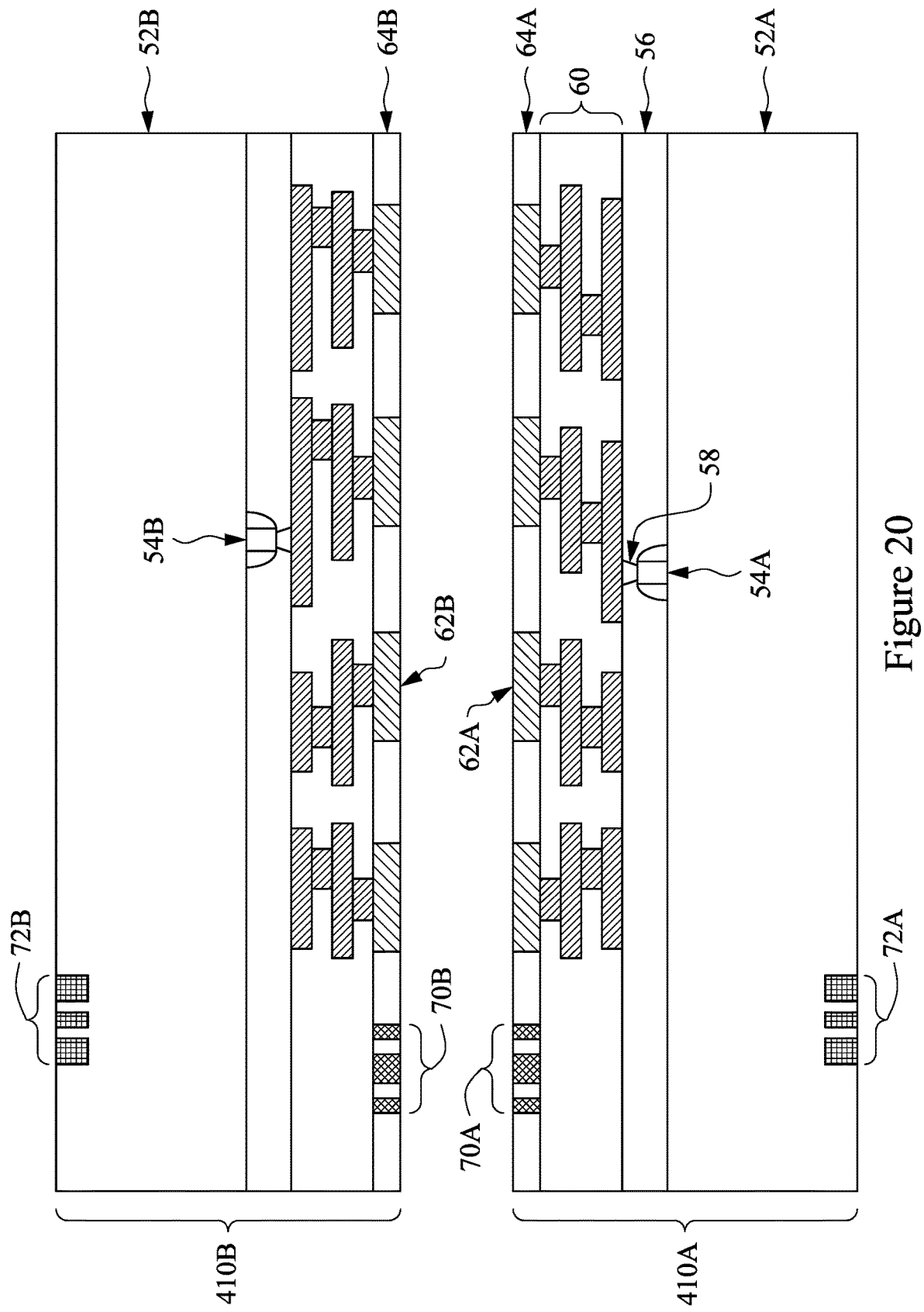
FIGS. 20 and 21 illustrate cross-sectional views of intermediate steps during a process for forming a bonded structure in accordance with some embodiments.
Figure 21:
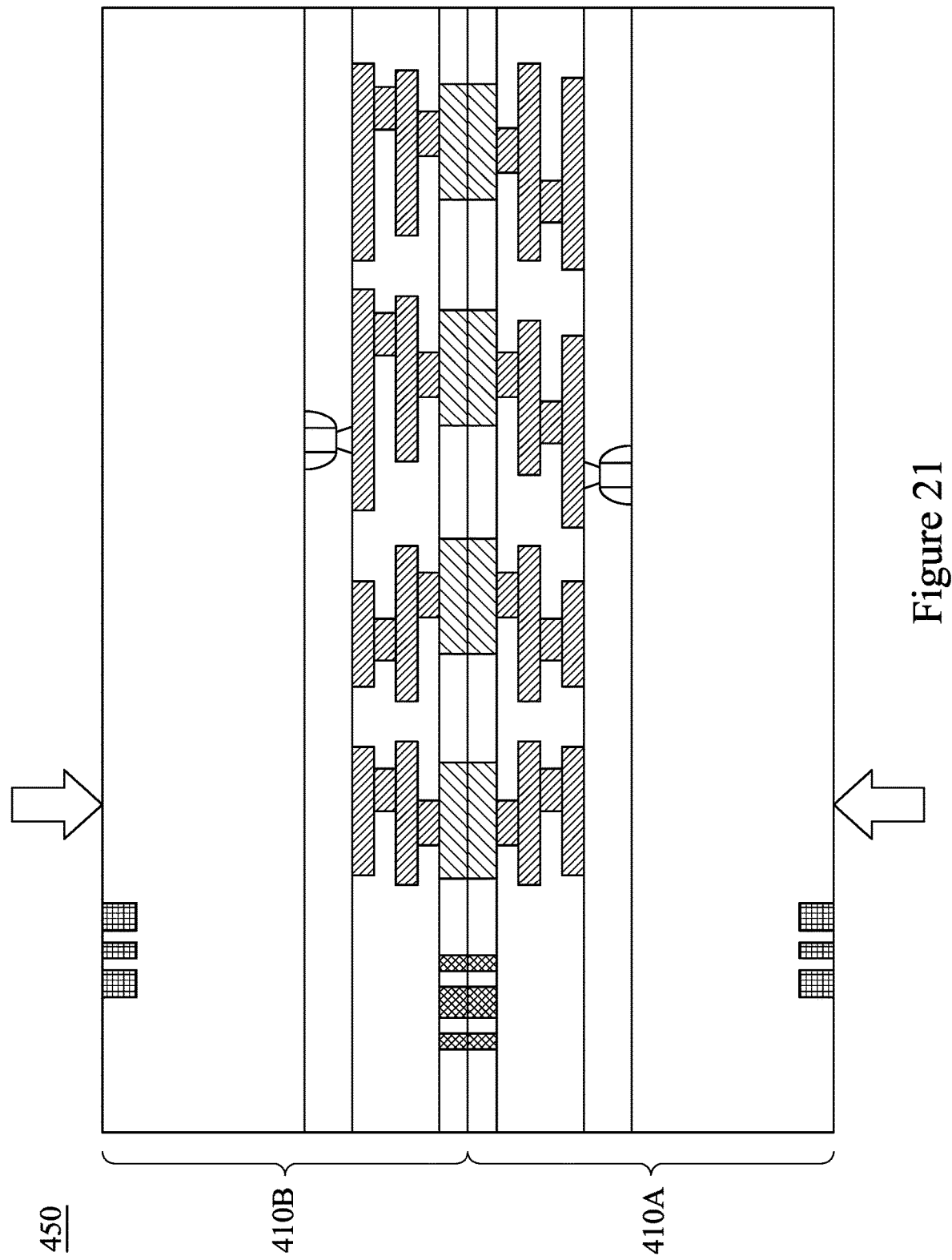

FIGS. 20 and 21 illustrate a first semiconductor device 410A and a second semiconductor device 410B that are bonded to form a bonded structure 450, in accordance with some embodiments. FIG. 20 shows the semiconductor devices 410A-B prior to bonding, and FIG. 21 shows the bonded structure 450 after bonding the semiconductor devices 410A-B, in accordance with some embodiments. The semiconductor devices 410A-B may be bonded using a bonding system such as bonding systems 100 or 300 described herein, and using bonding techniques described previously herein. The semiconductor devices 410A-B may be similar to the semiconductor devices 50, 110A-B, 210A-B, or 310A-B described previously. For example, the semiconductor devices 410A-B may comprise front-side alignment marks 70A-B, back-side alignment marks 72A-B, devices 54A-B (e.g., active and/or passive devices), interconnect structures 60, conductive pads 62A-B, and/or surface dielectric layers 64A-B. In other embodiments, the semiconductor devices 410A-B may comprise other features than these or another combination of features than these.

The semiconductor devices 410A-B may be, for example, chips, wafers, dies, packages, or the like. One or both of the semiconductor devices 410A-B may be a logic device, such as a central processing unit (CPU), graphics processing unit (GPU), system-on-a-chip (SoC), microcontroller, or the like. One or both of the semiconductor devices 410A-B may be a memory device, such as a dynamic random access memory (DRAM) die, static random access memory (SRAM) die, hybrid memory cube (HMC) module, a high bandwidth memory (HBM) module, or the like. The semiconductor devices 410A-B may be formed in processes of a same technology node, or may be formed in processes of different technology nodes. For example, the first semiconductor device 410A may be of a more advanced process node than the second semiconductor device 410B.

The semiconductor devices 410A-B may be similar types of devices or different types of devices. For example, in some embodiments, both of the semiconductor devices 410A-B comprise integrated circuit dies, such as CMOS dies or the like. In some embodiments, one of the semiconductor devices 410A-B may comprise regions of one type of transistor (e.g., n-type or p-type) and the other of the semiconductor devices 410A-B may comprise regions of the other type of transistor. For example. The first semiconductor device 410A may comprise n-type FETs (e.g., NFETs) coupled to the conductive pads 62A and the second semiconductor device 410B may comprise p-type FETs (e.g., PFETs) coupled to the conductive pads 62B. The conductive pads 62A-B may be bonded during the bonding process such that the n-type FETs are coupled to the p-type FETs in the bonded structure 450. In some embodiments, the second semiconductor device 410B may comprise a memory array (e.g., an SRAM array or the like) and the first semiconductor device 410A may comprise a logic device (e.g., a peripheral logic circuit). The semiconductor devices 410A-B and bonded structure 450 described above are intended as illustrative examples of devices that may be bonded to form a bonded structure using the techniques described herein, and other types or combinations of devices, components, or bonded structures are possible.

Figure 22:
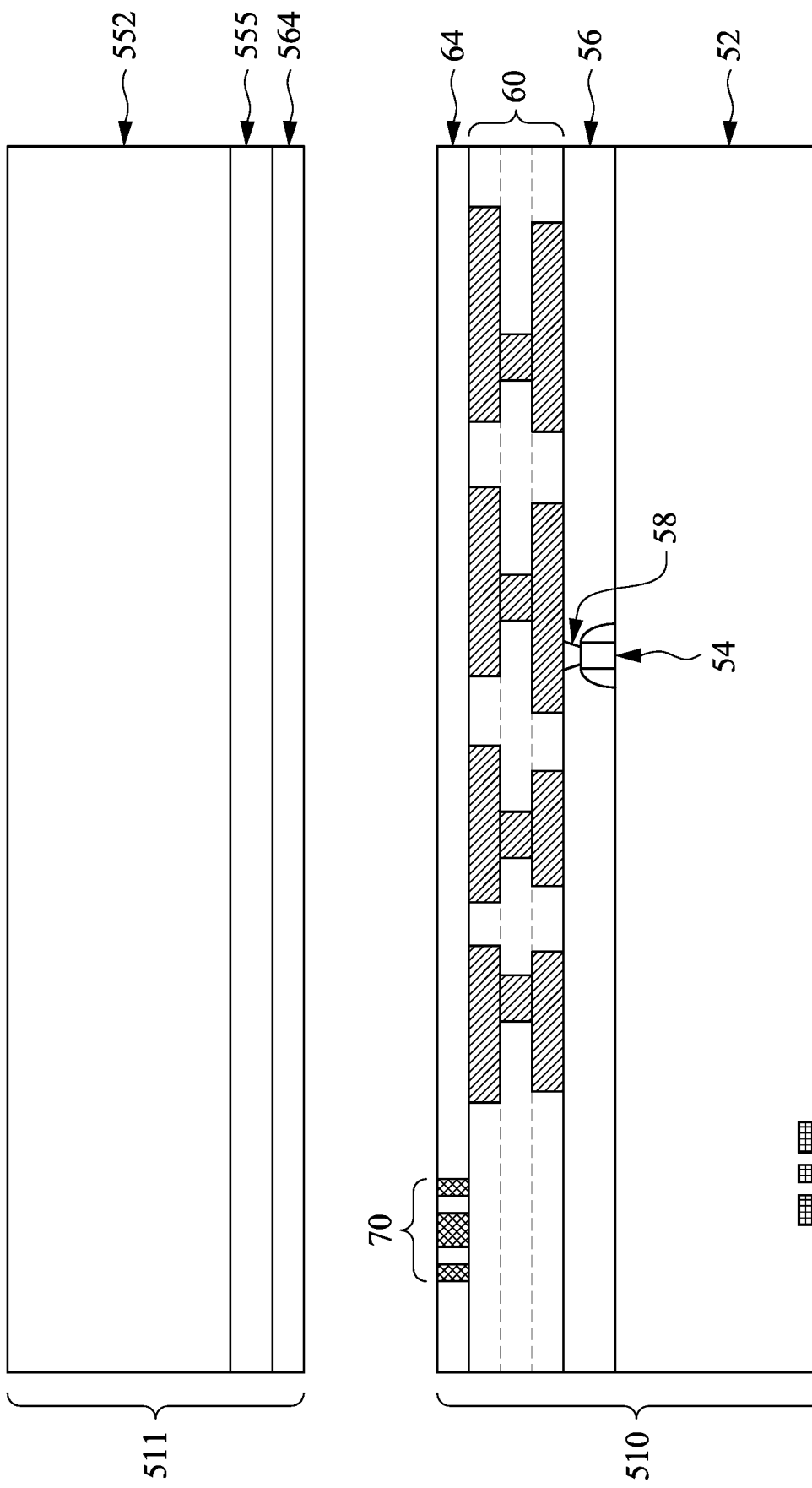
FIGS. 22, 23, and 24 illustrate cross-sectional views of intermediate steps during a process for forming a bonded structure in accordance with some embodiments.
Figure 23:
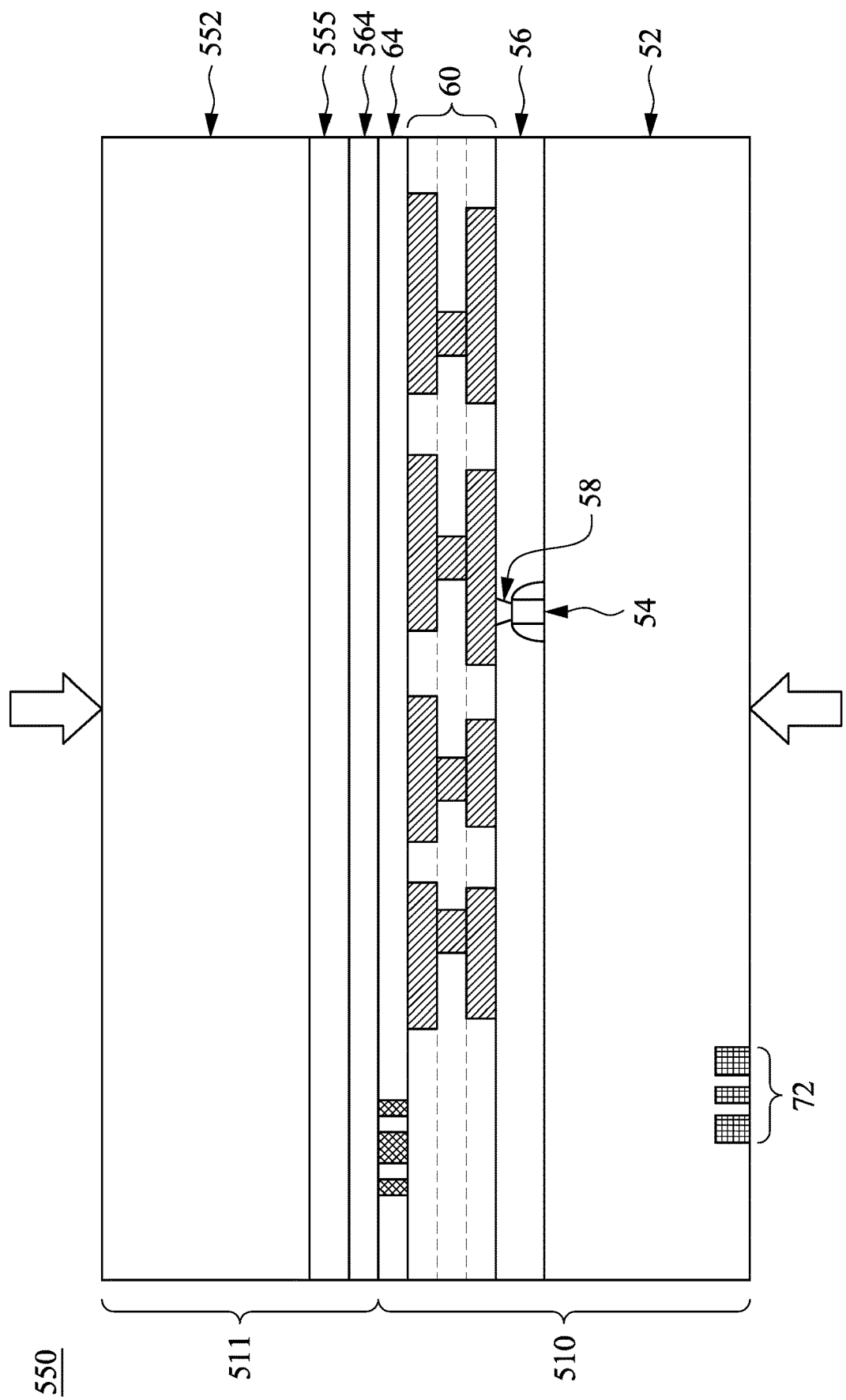
Figure 24:
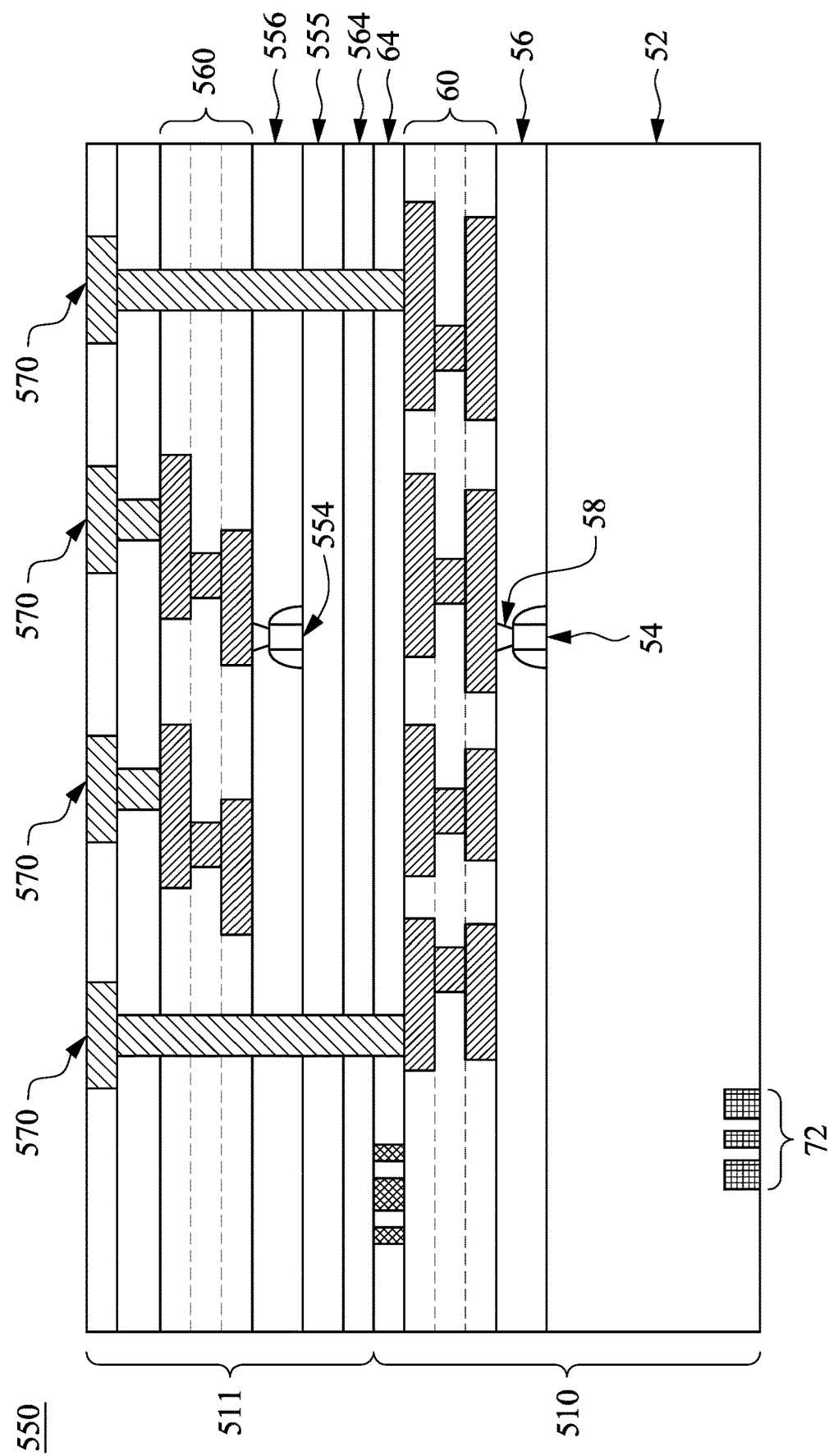

FIGS. 22 through 24 illustrate intermediate steps in the formation of a bonded structure 550 (see FIG. 24), in accordance with some embodiments. Turning to FIG. 22, a semiconductor device 510 and a substrate 511 are shown, in accordance with some embodiments. The semiconductor device 510 and substrate 511 are subsequently bonded (see FIG. 23) as part of the formation of the bonded structure 550. The semiconductor device 510 may be similar to the semiconductor devices 50, 110A-B, 210A-B, 310A-B, or 410A-B described previously. For example, the semiconductor device 510 may comprise a back-side alignment mark 72, devices 54 (e.g., active and/or passive devices), conductive pads 62, and/or a surface dielectric layer 64. In some embodiments, the semiconductor device 510 comprises an optional front-side alignment mark 70. In other embodiments, the semiconductor devices 510 may comprise other features than these or another combination of features than these. In some embodiments, an offset may be determined between the front-side alignment mark 70 and the back-side alignment mark 72. The offset may be similar to the offset 80 described previously.

The substrate 511 may comprise a semiconductor substrate 552, a semiconductor layer 555, and/or a surface dielectric layer 564, in accordance with some embodiments. The semiconductor substrate 552 may be similar to the semiconductor substrate 52. For example, the semiconductor substrate 552 may be a silicon wafer, a semiconductor-on-insulator (SOI) substrate, or the like.

The semiconductor layer 555 may be one or more layers of a semiconductor material such as silicon, doped or undoped, an active layer of a SOI substrate, an active layer of a semiconductor-on-sapphire substrate, or the like. The semiconductor layer 555 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The semiconductor layer 555 may be part of the semiconductor substrate 552 or may be the same material as the semiconductor substrate 552, in some embodiments. In some embodiments, the semiconductor layer 555 may be different from the semiconductor substrate 552. For example, the semiconductor substrate 552 may be silicon and the semiconductor layer 555 may be SiGe, though other materials than these are possible. In some embodiments, a surface dielectric layer 564 is formed on the semiconductor layer 555, which may be similar to the surface dielectric layer 64 described previously.

In FIG. 23, the substrate 511 is bonded to the semiconductor device 510, forming a bonded structure 550, in accordance with some embodiments. For example, the surface dielectric layer 564 may be bonded to the surface dielectric layer 64 using dielectric-to-dielectric bonding, oxide-to-oxide bonding, or another type of bonding. The bonding may be performed using a bonding process similar to those described previously.

In FIG. 24, the bonded structure 550 is processed further to form devices 554, in accordance with some embodiments. The processing may include various suitable semiconductor processing steps such as photolithographic steps or those used to form the semiconductor device 50. In some embodiments, the location of the front-side alignment mark 70 may be used to align photomasks during various photolithographic steps. In some embodiments, the location of the front-side alignment mark 70 may be determined from the previously determined offset and the location of the back-side alignment mark 72. The location of the back-side alignment mark 72 may be detected using a microscope or the like, similar to the process described in FIGS. 3A-B. In this manner, the alignment of the photomasks may be improved, which can improve device performance and yield.

In some embodiments, the semiconductor substrate 552 may be removed or partially removed using, for example, grinding, CMP, etching, the like, or a combination thereof. The devices 554 (represented by a transistor in FIG. 24) may be formed at the surface of the semiconductor layer 555, in some embodiments. The devices 554 may be similar to the devices 54 and may be, for example, integrated circuit devices or the like comprising active and/or passive devices. The devices 554 of the bonded structure 550 may be similar to or different from the devices 54 of the bonded structure 550. For example, in some embodiments, the devices 54 may comprise n-type FETs and the devices 554 may comprise p-type FETs. Other devices or combinations of devices are possible.

In some embodiments, an ILD 556 is formed that surrounds and may cover the devices 554. The ILD 556 may be similar to the ILD 56 described previously. In some embodiments, an interconnect structure 560 may be formed over the ILD 556 to interconnect the devices 554. The interconnect structure 560 may be similar to the interconnect structure 60 described previously. For example, the interconnect structure 560 may comprise one or more metallization patterns in one or more dielectric layers on the ILD 566. In some embodiments, conductive features 570 may be formed over the interconnect structure 560 or extending through the interconnect structure 560. The conductive features 570 may include conductive pads, through vias, or the like. For example, the conductive features 570 may include through vias that extend through the interconnect structure 560 to physically and electrically contact the interconnect structure 60. For example, in some embodiments, trenches may be etched that expose conductive regions of the interconnect structure 60, and then conductive material deposited in the trenches to form the through vias. Other techniques for forming through vias or other conductive features 570 are possible. In this manner, a bonded structure 550 may be formed. The bonded structure 550 shown in FIG. 24 is an example, and other bonded structures 550 may be formed having different features or may be formed using different techniques.

Other features and processes may also be included in the embodiments described herein. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments described herein may achieve advantages. By aligning semiconductor devices using both front-side and back-side alignment marks, the alignment of the semiconductor devices can be improved during a bonding process. For example, an offset may be determined between a front-side alignment mark and a back-side alignment mark that allows the front-side alignment marks to be aligned by detecting the locations of the back-side alignment marks. This allows for improved alignment of the front-side alignment marks without requiring the front-side alignment marks to be detected (e.g., through the device or substrate) during alignment. In this manner, substrates or materials that are not transparent may be used for manufacturing a bonded structure, in some cases. This can allow for a larger variety of materials to be used within the semiconductor devices and can allow for design flexibility of opaque features (e.g., metal features) within the semiconductor devices. Additionally, any misalignment of the bonded structure after bonding can be more accurately measured by measuring the relative locations of the back-side alignment marks. This can allow for more efficient identification of good devices or process metrics. The bonding techniques described herein may be applied to a large variety of bonding processes (e.g., wafer-to-wafer, chip-to-chip, wafer-to-chip, etc.) and materials to form a large variety of bonded structures or the like. Additionally, in some cases, the techniques described herein may be performed without requiring additional equipment or specialized equipment.

In an embodiment, a method includes determining a first offset between a first alignment mark on a first side of a first wafer and a second alignment mark on a second side of the first wafer; aligning the first alignment mark of the first wafer to a third alignment mark on a first side of a second wafer, which includes detecting a location of the second alignment mark of the first wafer; determining a location of the first alignment mark of the first wafer based on the first offset and the location of the second alignment mark of the first wafer; and, based on the determined location of the first alignment mark, repositioning the first wafer to align the first alignment mark to the third alignment mark; and bonding the first side of the first wafer to the first side of the second wafer to form a bonded structure. In an embodiment, the method includes determining a second offset between the third alignment mark on the first side of the second wafer and a fourth alignment mark on a second side of the second wafer. In an embodiment, repositioning the first wafer to align the first alignment mark to the third alignment mark includes detecting a location of the fourth alignment mark of the second wafer; and determining a location of the third alignment mark of the second wafer based on the second offset and the location of the fourth alignment mark of the second wafer. In an embodiment, the method includes detecting a location of the second alignment mark on the bonded structure; detecting a location of the fourth alignment mark on the bonded structure; and determining a misalignment of the first alignment mark and the third alignment mark, wherein the determining is based on the first offset, the second offset, the location of the second alignment mark, and the location of the fourth alignment mark. In an embodiment, aligning the first alignment mark of the first wafer to the third alignment mark on the first side of the second wafer includes repositioning the second wafer to align the third alignment mark to the first alignment mark. In an embodiment, bonding the first side of the first wafer to the first side of the second wafer includes a hybrid bonding process. In an embodiment, bonding the first side of the first wafer to the first side of the second wafer electrically connects the first wafer to the second wafer. In an embodiment, the method includes debonding a carrier substrate from the bonded structure. In an embodiment, determining the first offset includes detecting the first alignment mark using a first microscope and detecting the second alignment mark using a second microscope.

In an embodiment, a method includes positioning a first semiconductor device over a second semiconductor device, wherein a front side of the first semiconductor device faces a front side of the second semiconductor device, wherein the front side of the first semiconductor device includes a first alignment feature and the front side of the second semiconductor device includes a second alignment feature; using a first microscope to detect a location of the second alignment feature, wherein the first microscope faces the front side of the second semiconductor device; after using the first microscope to detect the location of the second alignment feature, using a first marking tool to form a third alignment feature on a back side of the second semiconductor device, wherein a location of the third alignment feature is based on the location of the second alignment feature; using a second microscope to detect a location of the first alignment feature, wherein the second microscope faces the front side of the first semiconductor device; after using the second microscope to detect the location of the first alignment feature, using a second marking tool to form a fourth alignment feature on a back side of the first semiconductor device, wherein a location of the fourth alignment feature is based on the location of the first alignment feature; repositioning the first semiconductor device and the second semiconductor device to align the first alignment feature with the second alignment feature, wherein the repositioning is based on the location of the third alignment feature and the location of the fourth alignment feature; and bonding the first semiconductor device to the second semiconductor device. In an embodiment, the first alignment feature is a conductive feature of the first semiconductor device. In an embodiment, the first marking tool forms the third alignment feature using an electron beam. In an embodiment, the first microscope includes the second marking tool. In an embodiment, the first semiconductor device includes first semiconductor dies and the second semiconductor device includes second semiconductor dies. In an embodiment, bonding the first semiconductor device to the second semiconductor device includes bonding first conductive pads of the first semiconductor device to second conductive pads of the second semiconductor device. In an embodiment, the method includes determining a lateral offset between the first alignment feature and the fourth alignment feature, wherein the repositioning is further based on the lateral offset.

In an embodiment, a method includes placing a first device wafer on an upper holder, wherein the first device wafer includes a first front-side alignment mark; a first back-side alignment mark; a first interconnect structure; a first surface dielectric layer over the first interconnect structure; and first contact pads in the first surface dielectric layer, wherein the first contact pads are connected to the first interconnect structure;

placing a second device wafer on a lower holder, wherein the second device wafer includes a second front-side alignment mark; a second back-side alignment mark; a second interconnect structure; a second surface dielectric layer over the second interconnect structure; and second contact pads in the second surface dielectric layer, wherein the second contact pads are connected to the second interconnect structure; using a lower microscope, detecting locations of the first front-side alignment and of the second back-side alignment mark; using an upper microscope, detecting locations of the second front-side alignment mark and of the first back-side alignment mark; based on the locations of the first back-side alignment mark and of the second back-side alignment mark, determining a first alignment offset of the first front-side alignment mark to the second front-side alignment mark; based on the first alignment offset, aligning the first front-side alignment mark to the second front-side alignment mark; and bonding the first contact pads to the second contact pads. In an embodiment, the method includes, after bonding the first contact pads to the second contact pads, determining a second alignment offset of the first front-side alignment mark to the second front-side alignment mark, wherein the determining of the second alignment offset is based on the locations of the first back-side alignment mark and the second back-side alignment mark. In an embodiment, aligning the first front-side alignment mark to the second front-side alignment mark includes determining a third alignment offset of the first back-side alignment mark to the second back-side alignment mark. In an embodiment, the method includes bonding the first surface dielectric layer to the second surface dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   determining a first offset between a first alignment mark on a first side of a first wafer and a second alignment mark on a second side of the first wafer;
   aligning the first alignment mark of the first wafer to a third alignment mark on a first side of a second wafer, comprising:
      detecting a location of the second alignment mark of the first wafer;
      determining a location of the first alignment mark of the first wafer based on the first offset and the location of the second alignment mark of the first wafer; and
      based on the determined location of the first alignment mark, repositioning the first wafer to align the first alignment mark to the third alignment mark; and
   bonding the first side of the first wafer to the first side of the second wafer to form a bonded structure.

2. The method of claim 1 further comprising determining a second offset between the third alignment mark on the first side of the second wafer and a fourth alignment mark on a second side of the second wafer.

3. The method of claim 2, wherein repositioning the first wafer to align the first alignment mark to the third alignment mark comprises:
   detecting a location of the fourth alignment mark of the second wafer; and
   determining a location of the third alignment mark of the second wafer based on the second offset and the location of the fourth alignment mark of the second wafer.

4. The method of claim 2 further comprising:
   detecting a location of the second alignment mark on the bonded structure;
   detecting a location of the fourth alignment mark on the bonded structure; and
   determining a misalignment of the first alignment mark and the third alignment mark, wherein the determining is based on the first offset, the second offset, the location of the second alignment mark, and the location of the fourth alignment mark.

5. The method of claim 1, wherein aligning the first alignment mark of the first wafer to the third alignment mark on the first side of the second wafer further comprises repositioning the second wafer to align the third alignment mark to the first alignment mark.

6. The method of claim 1, wherein bonding the first side of the first wafer to the first side of the second wafer comprises a hybrid bonding process.

7. The method of claim 1, wherein bonding the first side of the first wafer to the first side of the second wafer electrically connects the first wafer to the second wafer.

8. The method of claim 1 further comprising debonding a carrier substrate from the bonded structure.

9. The method of claim 1, wherein determining the first offset comprises detecting the first alignment mark using a first microscope and detecting the second alignment mark using a second microscope.

10. A method, comprising:
    positioning a first semiconductor device over a second semiconductor device, wherein a front side of the first semiconductor device faces a front side of the second semiconductor device, wherein the front side of the first semiconductor device comprises a first alignment feature and the front side of the second semiconductor device comprises a second alignment feature;
    using a first microscope to detect a location of the second alignment feature, wherein the first microscope faces the front side of the second semiconductor device;
    after using the first microscope to detect the location of the second alignment feature, using a first marking tool to form a third alignment feature on a back side of the second semiconductor device, wherein a location of the third alignment feature is based on the location of the second alignment feature;
    using a second microscope to detect a location of the first alignment feature, wherein the second microscope faces the front side of the first semiconductor device;
    after using the second microscope to detect the location of the first alignment feature, using a second marking tool to form a fourth alignment feature on a back side of the first semiconductor device, wherein a location of the fourth alignment feature is based on the location of the first alignment feature;
    repositioning the first semiconductor device and the second semiconductor device to align the first alignment feature with the second alignment feature, wherein the repositioning is based on the location of the third alignment feature and the location of the fourth alignment feature; and
    bonding the first semiconductor device to the second semiconductor device.

11. The method of claim 10, wherein the first alignment feature is a conductive feature of the first semiconductor device.

12. The method of claim 10, wherein the first marking tool forms the third alignment feature using an electron beam.

13. The method of claim 10, wherein the first microscope comprises the second marking tool.

14. The method of claim 10, wherein the first semiconductor device comprises a plurality of first semiconductor dies and the second semiconductor device comprises a plurality of second semiconductor dies.

15. The method of claim 10, wherein bonding the first semiconductor device to the second semiconductor device comprises bonding first conductive pads of the first semiconductor device to second conductive pads of the second semiconductor device.

16. The method of claim 10 further comprising determining a lateral offset between the first alignment feature and the fourth alignment feature, wherein the repositioning is further based on the lateral offset.

17. A method comprising:
placing a first device wafer on an upper holder, wherein the first device wafer comprises:
  a first front-side alignment mark;
  a first back-side alignment mark;
  a first interconnect structure;
  a first surface dielectric layer over the first interconnect structure; and
  first contact pads in the first surface dielectric layer, wherein the first contact pads are connected to the first interconnect structure;
placing a second device wafer on a lower holder, wherein the second device wafer comprises:
  a second front-side alignment mark;
  a second back-side alignment mark;
  a second interconnect structure;
  a second surface dielectric layer over the second interconnect structure; and
  second contact pads in the second surface dielectric layer, wherein the second contact pads are connected to the second interconnect structure;
using a lower microscope, detecting locations of the first front-side alignment mark and of the second back-side alignment mark;
using an upper microscope, detecting locations of the second front-side alignment mark and of the first back-side alignment mark;
based on the locations of the first back-side alignment mark and of the second back-side alignment mark, determining a first alignment offset of the first front-side alignment mark to the second front-side alignment mark;
based on the first alignment offset, aligning the first front-side alignment mark to the second front-side alignment mark; and
bonding the first contact pads to the second contact pads.

18. The method of claim 17 further comprising, after bonding the first contact pads to the second contact pads, determining a second alignment offset of the first front-side alignment mark to the second front-side alignment mark, wherein the determining of the second alignment offset is based on the locations of the first back-side alignment mark and the second back-side alignment mark.

19. The method of claim 17, wherein aligning the first front-side alignment mark to the second front-side alignment mark further comprises determining a third alignment offset of the first back-side alignment mark to the second back-side alignment mark.

20. The method of claim 17 further comprising bonding the first surface dielectric layer to the second surface dielectric layer.

* * * * *